United States Patent [19]

Nichols

[11] 4,219,880

[45] Aug. 26, 1980

[54] SIGNAL-PROCESSING AND CONVERSION SYSTEMS

[75] Inventor: Charles R. Nichols, Pasadena, Calif.

[73] Assignee: Quad/Eight Electronics, N. Hollywood, Calif.

[21] Appl. No.: 902,455

[22] Filed: May 3, 1978

[51] Int. Cl.² .................. G06F 15/34; H03K 13/02
[52] U.S. Cl. .................................. 364/718; 179/1 J; 340/347 M
[58] Field of Search ...................... 364/718; 179/1 J; 340/347 M

[56] References Cited

U.S. PATENT DOCUMENTS

| | | | |
|---|---|---|---|
| 4,048,635 | 9/1977 | Bich | 235/310 X |
| 4,101,881 | 7/1978 | De Freitas | 179/1 J X |

OTHER PUBLICATIONS

M. R. Schroeder, "Natural Sounding Artificial Reverberation", *Jour. of the Audio Eng. Soc.*, Jul. 1962, vol. 10, No. 3, pp. 219-223.
Catalog Material for the "EMT 250 Electronic Reverberator Unit with Digital Processor", Jun. 1976.
F. F. Lee et al., "Floating Point Encoding for Transcription of High Fidelity Audio Signals", Preprint No. 1190 (L-1) of the Audio Engineering Society, 1976.
Oppenheim, *Applications of Digital Signal Processing*, Prentice-Hall 1978, pp. 29-77.
B. A. Blesser et al., "A Real-Time Digital Computer for Simulating Audio Systems", *Jour. of the Audio Eng. Soc.*, Nov. 1975, vol. 23, No. 9, pp. 698-707.
J. S. Kriz, "An Audio Analog-Digital-Analog Conversion System", Preprint No. 1142 (L-2) of the Audio Engineering Society, 1976.
J. P. Myers, "High Quality Professional Recording Using New Digital Techniques", Preprint No. 867 (J-3) of the Audio Engineering Society, 1972.
M. R. Schroeder et al., "'Colorless' Artificial Reverberation", *Jour. of the Audio Eng. Soc.*, Jul. 1961, vol. 9, No. 3, pp. 192-197.

*Primary Examiner*—Jerry Smith
*Attorney, Agent, or Firm*—Nilsson, Robbins, Dalgarn, Berliner, Carson & Wurst

[57] ABSTRACT

A signal-processing system, particularly adapted to digitally process analog signals, and including computation apparatus which carries out operations on the signals, also includes a control memory with storage locations addressable in predetermined sequences and an operand memory with storage locations addressable in variable sequences. The control memory contains control information which controls the operations of the computation apparatus and the operand memory contains operand information which is operated upon by the computation apparatus with the signals which are processed. The variable sequences in which the storage locations in the operand memory are addressed are in part determined by information in the control memory. The computation apparatus includes a multiplier, an adder, and a delay memory which is used in providing variable delays in signals during processing. The system is particularly adapted to provide digital reverberation effects, such as echo effects and the simulation of rooms (echo chambers) with variable characteristics. The system incorporates analog to digital and digital to analog conversion systems having ranging capabilities. Digital shifting structure with the capability to shift digits in adjoining digit positions to other positions representative of multiplication or division by variable factors are incorporated into the conversion systems. This eliminates the need to treat independent ranging digits during the computation process by providing an accurate, integrated numerical representation of the signals received and provided by the computation apparatus. Particular embodiments of the conversion systems and of the remainder of the signal-processing system operate in the desirable 2's complement (binary) number system.

10 Claims, 6 Drawing Figures

SIGNAL-PROCESSING AND CONVERSION SYSTEMS

FIELD OF THE INVENTION

The field of the invention includes the particular fields relating to systems for digitally processing signals representative of sound signals as well as analog to digital and digital to analog conversion systems, and the more general field relating to signal-processing systems.

BACKGROUND AND SUMMARY OF THE INVENTION

Well after the development of sophisticated digital signal-processing techniques, the processing of sound signals continued, and in fact still continues, to be dominated by analog processing systems. More than 15 years ago, the theoretical groundwork was laid for providing sound signals, through digital processing techniques, with reverberation effects. See M. R. Schroeder and B. F. Logan, "'Colorless' Artificial Reverberation", *Journal of the Audio Engineering Society,* July, 1961, vol. 9, no. 3, pp. 192-197, and M. R. Schroeder, "Natural Sounding Artificial Reverberation", *Journal of the Audio Engineering Society,* July, 1962, vol. 10, no. 3, pp. 219-223. This work concluded that through the use of a multiplier, a signal delaying element and an adder, a sound signal transmitted in a totally non-reverberating environment could be digitally processed to provide it with realistic reverberation effects. For example, such a signal might be processed to sound as though its source were in a room having a variable size and having walls (and perhaps contents) with varying absorption characteristics. In this regard, the general rate of decay of the initial sound and successive echoes is generally characterized as a reverberation time; the timing of echo effects might be generally characterized as a room size variable; and the absorption characteristics which typically result in the decay of higher frequency signals faster than lower frequency signals, might be characterized as a high frequency damping variable.

Somewhat of an appreciation for this theoretical work may be garnered by considering that if a sound signal, e.g., a person singing, is directed at a wall, a person standing next to the singer will, after an interval dependent on the distance of the wall from the singer, hear what the singer is currently singing as well as a softer version of what was being sung at the start of the interval. The softer version will also differ in other respects, depending on the characteristics of the wall (and room contents). Thus, in general, the higher frequency components of the singing will be softer in the echo signal than the lower frequency components. Implementing this effect then generally calls for the addition of a delayed variation of the original signal to the original signal. A general softening of the delayed signal can, for example, be produced by a multiplication of the original signal by a factor that is less than one. Similarly, an increased softening of the higher frequencies in the delayed signal can conveniently be implemented by dividing the generally delayed, softened signal into two components, both further softened and one additionally delayed. This illustration, although rather simple and thus indicative of an elemental environment, indicates very well how a more complicated environment (e.g., a complete room) can be simulated by computation apparatus which includes a multiplier, an adder and a delay element.

Digital processing is in general qualitatively superior to analog processing as a result of the fact that once the signal to be processed is in a digitally-represented form it is not subject to the type of signal degradation that occurs in analog processing. Thus, the signal is represented as a group of digits which are then processed in that form rather than as a "physical" variable (e.g., a voltage) subject to the type of distortion inherent in analog processing techniques. An experimental system, grounded in the theoretical work, and directed at exploiting this superiority, was implemented more than 10 years after the theoretical work was done. See Barry A. Blesser, Karlo Baeder and Ralph Zaorski, "A Real-Time Digital Computer for Simulating Audio Systems", *Journal of the Audio Engineering Society,* November, 1975, vol. 23, no. 3, pp. 698-707. A particular commercial implementation was also developed, as indicated by catalog material for the "EMT 250 Electronic Reverberator Unit With Digital Processing", e.g. dated June, 1976, and Hugh Ford, "EMT 250 Electronic Reverberator Unit", *Studio Sound,* April, 1977, pp, 52, 54 and 56. The aforementioned superiority is, however, conventionally accompanied by recognized, significant disadvantages:

"The digital domain offers audio engineers the possibility of designing systems whose quality is significantly better than the analog counterpart. However, in exchange for this benefit the audio engineer acquires higher cost, extra difficulty in design, experimentation, construction, and evaluation . . . " Blesser et al. at P. 706.

These disadvantages, for a large majority of applications, are traditionally viewed as overriding the advantages over such counterparts.

The present system addresses these disadvantages by incorporating structure representing a divergence from conventional digital signal-processing apparatus, as conventionally applied to the digital processing of sound signals (or signals representative thereof). This structure is, however, also broadly applicable to general signal-processing systems.

More particularly, the present invention incorporates in a signal-processing system, a first storage means for storing control information in storage locations which are addressable in predetermined sequences and a second storage means for storing operand information in storage locations which are addressable in variable sequences. The control information controls the operations performed by computation means incorporated in the system, and the operand information provides operands which are operated on by the computation means along with the signal which is processed. The invention in general eliminates the need for "JUMP" or "BRANCHING" instructions, i.e. the general dependence of an addressing sequence for an information storage element for storing control information on previously addressed information in that storage element or on external information, and results in substantial economic savings.

A more particular feature of the present invention makes the variable addressing sequences of storage locations in the second storage means in part dependent upon information in storage locations in the first storage means. In addition, a more general aspect of the present invention incorporates the aforementioned storage means structure and addressing, without reference to the types of computation information in the two storage means.

It is evident that a system which receives analog signals, e.g. representative of sound signals, for digital processing, requires an analog to digital conversion system to convert an analog input signal to the digital domain and a digital to analog conversion system to convert digital signals representative of the processed analog signal, back to the analog domain. The actual converters, i.e., the devices that accept a signal in one domain and convert it to the other domain, generally are more difficult and costly to realize as the number of digits they provide or accept, increase. Due to this fact, "ranging" techniques have been developed to provide advantages associated with more digits without increasing the number of digits which a converter element provides or receives.

By way of illustration, one might suppose that an analog to digital converter element in an analog to digital conversion system will provide three binary output digits representative of input voltage values of an analog signal, that are between 0 and 7 volts. However, an analog signal representative of a sound signal varies between 0 and 28 volts. According to this system, the bits or digits and the analog values they represent might be as follows:

| Value | Binary Representation |
|-------|----------------------|
| 0 | 000 |
| 1 | 001 |
| 2 | 010 |
| 3 | 011 |
| 4 | 100 |
| 5 | 101 |
| 6 | 110 |
| 7 | 111 |

According to this system, it might further be assumed that 0.1, 0.2, 0.3, and 0.4 might be represented by 000, and 0.5, 0.6, 0.7, 0.8, and 0.9 as 001, with the same rounding effect operable between each whole number.

To illustrate the application of ranging, one might then conventionally consider a received voltage between 0 and 7 volts as falling within a first value range having a binary representation of 00, a received voltage of 7 to 14 volts as falling in a second range having a binary representation of 01; and a received voltage of 14 to 28 volts as falling in a third range represented by 10. These ranges might then conventionally indicate that signal values in the first range are acceptable to the converter element (i.e., are acceptable if divided by $2^0$ prior to transmittal to the converter element); signal values in the second range must be divided by $2^1(2)$ prior to transmittal to the converter element; and signal values in the third range must be divided by $2^2(4)$ prior to such transmittal. Through this illustration, it may be appreciated that the two ranging bits along with the three output bits from the converter element ("converter bits") together digitally-represent a voltage value between 0 and 28 volts. Assuming one subsequently desired to perform computations (e.g., multiplications and additions), utilizing the digital representation, such operations might generally entail significant complications as a result of the essentially independent sets of bits required to represent a voltage value. See, e.g., John P. Meyers, "High Quality Professional Recording Using New Digital Techniques", *Preprint No. 867 (J-3) of the Audio Engineering Society* (1972). Some conventional apparatus may attempt to address complications of this sort. See J. Stanley Kriz, "An Audio Analog-Digital-Analog Conversion System", *Preprint No. 1142(L-2) of the Audio Engineering Society* (1976); and catalog material for the "EMT Electronic Reverberator with Digital Processing", and Ford, supra.

Further along these lines, in conjunction with multipliers and adders, as well as other applications, it has become convenient and economical to use a 2's complement binary number system. The application of this system to ranging in analog to digital conversions might be illustrated, along the above lines, as follows.

It may, first of all, be assumed that the converter element is able to accept, for conversion, voltage values between $-1$ and $+1$ volts, and can then convert such values to a three-bit binary representation, one bit of which is a sign bit. According to the standard 2's complement number system, and again assuming rounding (quantization) along the lines previously indicated, the correlation between the received voltage "V" and the resulting 2's complement digital representation would be as follows:

| Value | Range of Values | Binary Representation |
|-------|-----------------|----------------------|
| $+\frac{3}{4}$ | ($\frac{5}{8} \leq V < \frac{7}{8}$) | 0̲11 |
| $+\frac{1}{2}$ | ($\frac{3}{8} \leq V < \frac{5}{8}$) | 0̲10 |
| $+\frac{1}{4}$ | ($\frac{1}{8} \leq V < \frac{3}{8}$) | 0̲01 |
| 0 | ($-\frac{1}{8} \leq V < \frac{1}{8}$) | 0̲00 |
| $-\frac{1}{4}$ | ($-\frac{3}{8} \leq V < -\frac{1}{8}$) | 1̲11 |
| $-\frac{1}{2}$ | ($-\frac{5}{8} \leq V < -\frac{3}{8}$) | 1̲10 |
| $-\frac{3}{4}$ | ($-\frac{7}{8} \leq V < -\frac{5}{8}$) | 1̲01 |
| $-1$ | ($-1 \leq V < -\frac{7}{8}$) | 1̲00 |

Then, for example, the 0̲01 is interpreted as having a "+" sign (underlined digit) and an absolute value of $(0 \times 2^{-1}) + (1 \times 2^{-2}) = \frac{1}{4}$, thus a completely expressed value of $+\frac{1}{4}$. Similarly, the 1̲10 is then interpreted as having a "−" sign and an absolute value of $1 - ((1 \times 2^{-1}) + (0 \times 2^{-2})) = 1 - \frac{1}{2}$, thus a completely expressed value of $-\frac{1}{2}$.

Somewhat of an intuitive appreciation for the advantages of a 2's complement representation may be garnered from the fact that it is generally considered disadvantageous in digital processing systems to include elements which directly perform subtractions, and advantageous to employ in place thereof elements which perform additions. A 2's complement representation can then, among other things, easily provide for the use of an adder for both addition and subtraction.

Applying ranging to the above 2's complement illustration, and, as shown in the chart, assuming rounding (quantization) along the lines previously indicated (e.g., $+\frac{1}{8}$ through (any value) less than $+\frac{3}{8}$ is represented as 0̲01, $-\frac{1}{8}$ through (any value) less than $+\frac{1}{8}$ is represented as 0̲00, $+\frac{3}{8}$ through (any value) less than $+\frac{5}{8}$ is represented as 0̲11, etc.), the application of ranging to a 2's complement numbering system and analog to digital converter element might conventionally be generally along the following lines.

First, define a first range for signals having a value greater than or equal to $+7/16$ volt, and less than $+\frac{7}{8}$ volt, or less than or equal to $-7/16$ volt and greater than $-\frac{7}{8}$ volt (also less than $-\frac{7}{8}$ volt and greater than $-1$ volt). This range would be indicative of no multiplication (or multiplication by one) before transmittal to the converter element, and e.g., represented by the two digits 00. Similarly, a second range, indicative of a multiplication by $2^1(2)$ and represented by, e.g., 01, would be applicable to signals having a value greater than or equal to +7/32 volt and less than +7/16 volt, or less than or equal to −7/32 volt and greater than −7/16 volt. A third range, indicative of a multiplication by four and, e.g. represented by 10 would then apply to signals having a value greater than −7/32 volt and less than +7/32 volt. This is, of course, merely illustrative.

Somewhat along the lines illustrated for the standard binary ranging, it is evident that in the absence of the 2's complement ranging, for example, input values of 1/32 and 1/16 volt would both be converted to 000. However, with the ranging, extrapolated to include a multiplication by eight for a fourth range represented by the ranging bits 11, 1/32 volt would be multiplied by eight and represented by the ranging bits 11 and the three digits constituting the 2's complement representation for +¼, or 001. Similarly, 1/16 volt would be represented by the same ranging digits and 010. Thus, the ranging preserves information that would otherwise be lost. Though incorporating advantages for certain applications over a conventional binary ranging system, the 2's complement ranging, as illustrated, also presents the problem of handling two essentially distinct groups of digits representative of a single value.

In the context of analog to digital conversion, conversion aspects of the present invention (applicable to any digital representation, e.g. binary, decimal) include structure for integrating the two essentially independent sets of digits. Further, this structure integrates them into a set of digits which in fact may accurately, without any accompanying information, represent the value received before any ranging operations (e.g., multiplications) or conversion. This structure accomplishes this integrated representation through a manipulation including a shifting of digits in a plurality of adjoining digit positions to other positions, subject to the control of the ranging information (bits). The shifted positions, when compared to the unshifted positions, represent a shift of the digits a number of positions corresponding to a dividing factor. This dividing factor is in fact indicative of the multiplication factor represented by the ranging bits, and results in the aforementioned integrated representation. Particular structure which accomplishes the manipulation is particularly adapted to function in a 2's complement binary number system. Further, in a digital to analog conversion system, analogous shifting structure accomplishes an analogous result. A particular component, in integrated circuit form, which is termed a "Four-Bit Shifter" and sold under the designation "Am25S10", as described in specification material related thereto, and application notes by John R. Mick, entitled "Am25S10 Four-Bit Shifter", is, for example, one component that is particularly useful in implementing the shifting structure.

Another problem which is introduced by ranging may be appreciated by reference to matters which have already been discussed. Focusing on ranging in a 2's complement environment and with respect to analog to digital conversion, it is evident that inaccuracies in the multiplication process may introduce unintended errors into the ranging process. Such errors would normally be introduced, to at least some extent, by nonlinearities in electronic devices. By way of a simplified illustration, a resistance equal to 100 ohms which has a voltage drop across it equal to 1 volt for a current of 0.01 amperes, instead of having a voltage of 2 volts for 0.02 amperes, might due to its nonlinearities, have a voltage of 2.1 volts. With respect to the processing of signals representative of sound signals and analog to digital conversion, these effects will normally be noticed by a listener if there are changes in range, in rapid succession. Although such changes in rapid succession would not normally be restricted where a ranging multiplication factor is decreasing, since a value received by the converter element may otherwise become too large for the range of the element, restrictions in such rapid changes wherein these changes would otherwise result in, for example, successions of increasing or alternating multiplication factors, can be implemented. In this regard, the sacrificing of the advantages of ranging during a period of approximately 100 milliseconds will generally not be noticed by the human ear due to a physiological phenomenon known as the "finite recovery time" of human hearing. See Francis F. Lee and David Lipschutz, "Floating Point Encoding for Transcription of High Fidelity Audio Signals", *Preprint No.* 1190(*L*-1) *of the Audio Engineering Society* (1976). Generally, this recovery time makes the human ear insensitive to a relatively softer sound for approximately 100 milliseconds after a relatively louder sound.

As indicated previously, conversion aspects of the present invention which have been referred to, incorporate structure relating to the implementation of ranging in a digital to analog conversion system, as well as an analog to digital conversion system. An additional conversion aspect incorporates timing structure into a digital to analog conversion system which accomplishes restrictions in range changes, somewhat along the lines indicated above, with reference to an analog to digital system.

BRIEF DESCRIPTION OF THE DRAWINGS

In the drawings, exemplary embodiments demonstrating the various objectives and features hereof are set forth as follows:

FIG. 1 comprising

DESCRIPTION OF ILLUSTRATIVE EMBODIMENT

As indicated above, a detailed illustrative embodiment of the invention is disclosed herein. However, embodiments may be constructed in accordance with various forms, some of which may be rather different from the disclosed illustrative embodiment. Consequently, the specific structural and functional details disclosed herein are merely representative, yet in that regard are deemed to provide the best embodiment for purposes of disclosure and to provide a basis for the claims herein which define the scope of the present invention.

Figure 1A:
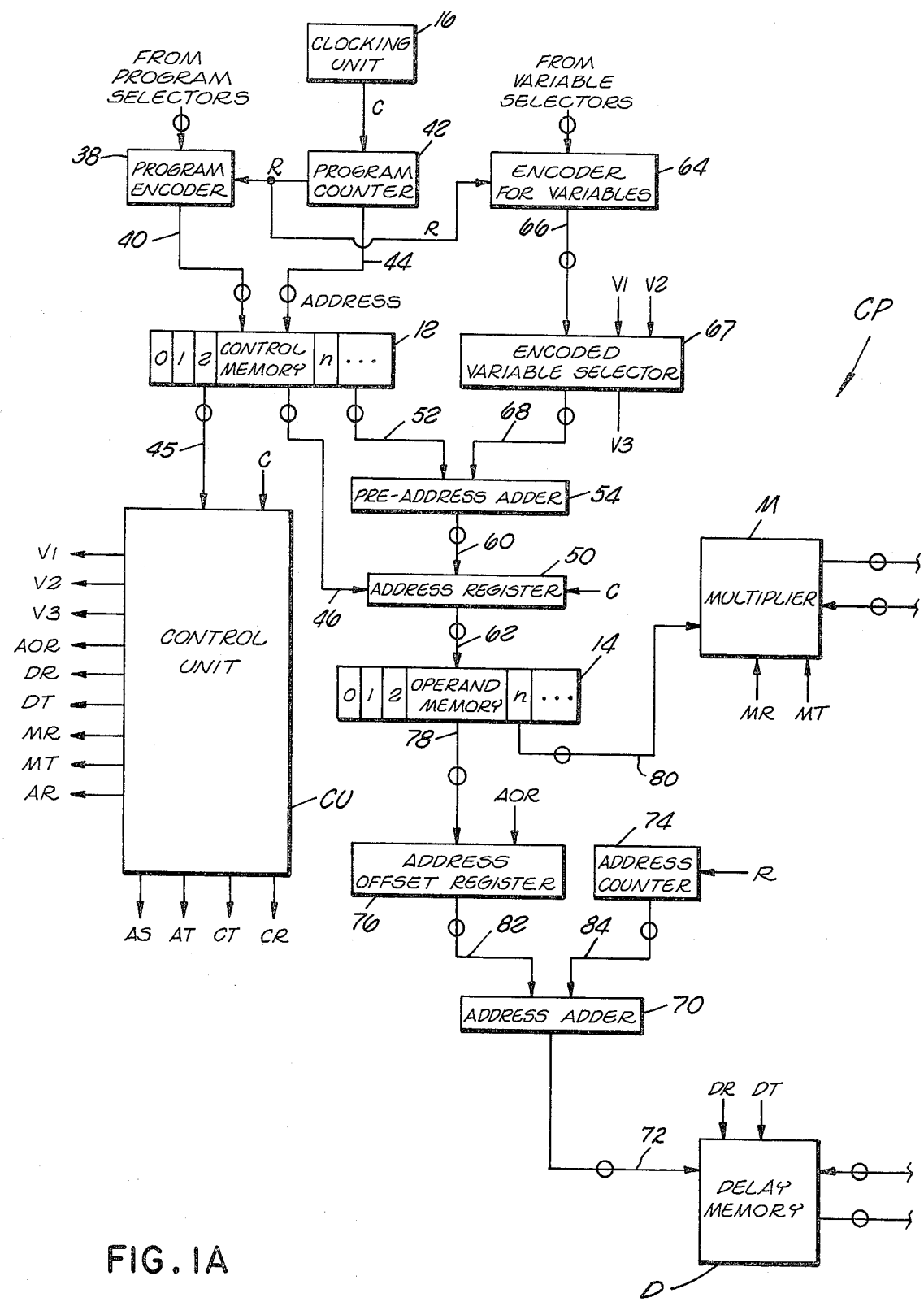
FIGS. 1A and 1B is a block diagram of a signal-processing system in accordance with the present invention.
Figure 1B:
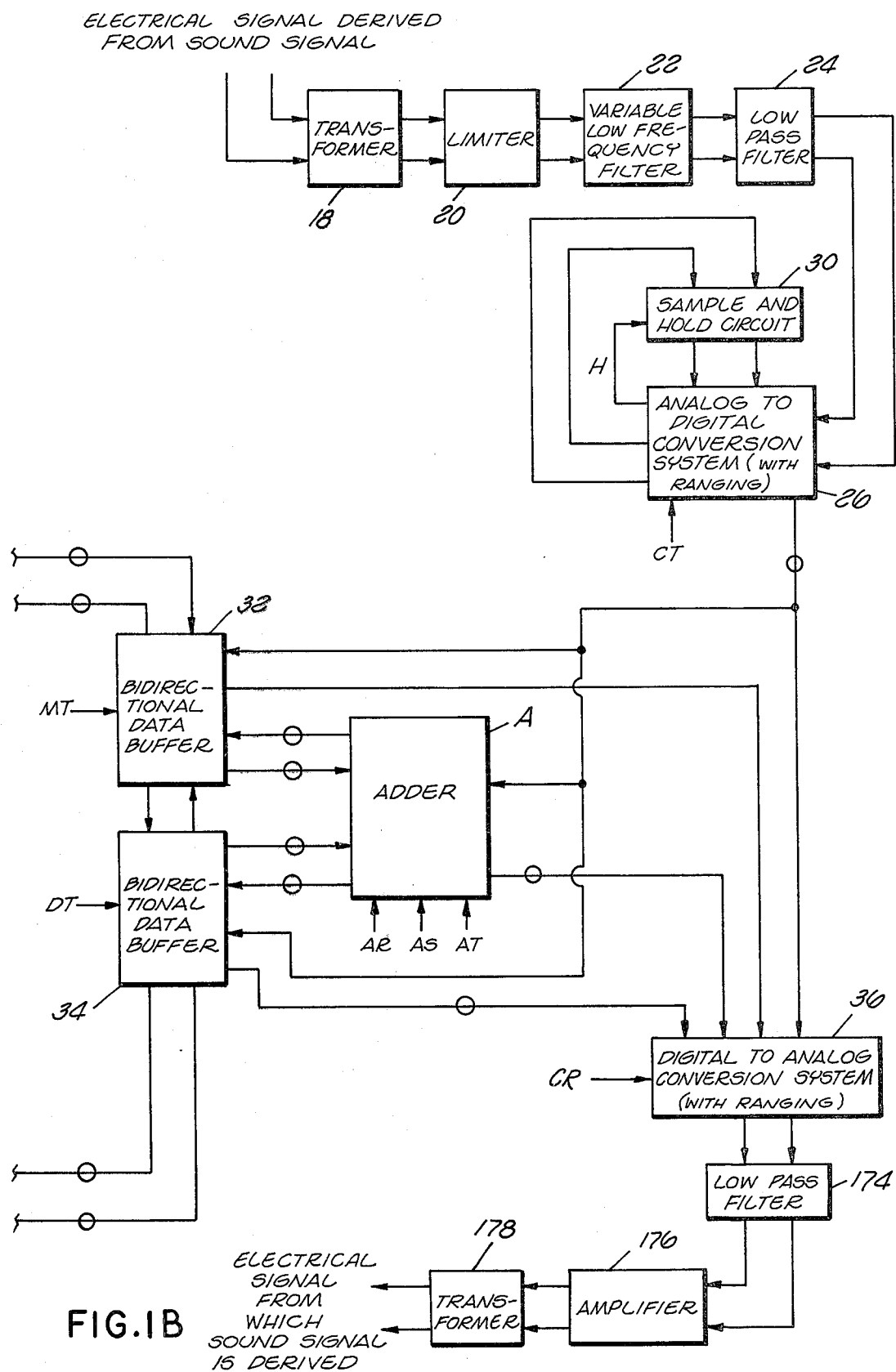

Referring to FIG. 1, a signal-processing system generally includes analog to digital converter apparatus (upper right) which is employed to convert a generally continuous, analog signal to a digitally-represented signal; a digital processing system (middle and left); and digital to analog converter apparatus (lower right) which is employed to convert a digitally-represented processed signal back to an analog representation. The digital processing system includes computation apparatus CP, which in turn includes a multiplier M, an adder A and a delay memory D, and which has the capability to perform operations on digitally-represented signals. As indicated, these operations include multiplication, addition, and the implementation of delays. (It is noted that a modified, more limited computation apparatus in a system along the lines of FIG. 1 would, of course, offer less operational capabilities, and a modified, more extensive apparatus, more operational capabilities.)

The computation apparatus, as well as other elements, are subject to the control of controller apparatus (upper and middle left). In the controller apparatus, a control memory 12 and an operand memory 14 contain stored information, including information which controls the operations of the multiplier M, adder A and delay memory D, as well as other elements of the system, and information representative of multiplication factors and delay intervals used by the computation apparatus in carrying out its processing functions. Signal-represented information is received from the control memory 12 by a control unit CU which provides this information in the form of control signals over a number of control lines. These control signals are digital signals which may be either singularly high or low during successive intervals bounded by the rising edge of a clock pulse and the rising edge of the successive clock pulse. For example, during an interval in which the adder A is to transmit a signal-represented sum that it has previously calculated, the control signal AT provided to the adder will be high. The control signal AT, assuming it was previously low, will become high along the leading edge of a clock pulse, and assuming it is to return to its low state, again become low along the rising edge of the next clock pulse. The control unit may be implemented along conventional lines in the form of single bit storage devices which store an input signal starting on the rising edge of a clock pulse and then store a successive input signal on the rising edge of the next clock pulse. Thus, a clocking signal C from a clocking unit 16 is provided to the control unit CU. These devices are commonly characterized as "latches", but can more descriptively be characterized as "latched single bit storage elements".

Typically, an input electrical signal derived e.g. from a sound signal, as indicated in FIG. 1, in the form of an essentially continuous analog signal is received by a transformer 18 and altered along well known lines (e.g., referenced to system ground) to preserve its essential character but make it compatible with the rest of the system. When, due to the unexpected loudness of the sound signal, the signal from the transformer is outside the range which the remainder of the system is designed to handle, a limiter 20, also implemented along well known lines, will appropriately reduce the level of this signal. A variable low frequency filter 22, in conjunction with a low pass filter 24, permit frequency components generally within a certain range, to pass to the remainder of the system for processing. For processing signals representative of sound signals, a low frequency filter having choices of 20 hertz, 100 hertz, 250 hertz or 500 hertz as a cut-off frequency and a low pass filter having a cut-off frequency of 8 kHz have proved satisfactory, though many other choices are, of course, possible. From the low pass filter 24, the still analog electrical signal is received by ranging apparatus in an analog to digital conversion system 26 associated with a sample and hold circuit 30.

In conjunction with the ranging aspect of the conversion system, a variable amplification (which may be by a factor of 1) of the received signal, is performed prior to output to the sample and hold circuit 30. In conjunction with other aspects of the conversion system, under the control of a control signal CT from the controller unit CU, which instructs the analog to digital conversion system to obtain a sample of the amplified analog signal and provide a digital representation thereof, the analog to digital conversion system 26 causes a high triggering pulse to occur along a normally low holding signal H, which pulse causes the sample and hold circuit to hold an instantaneous value of the analog signal which it is tracking. The value of this signal sample is then converted to a digital representation by a converter in the analog to digital conversion system 26, which digitally represented signal is modified by the ranging apparatus in the analog to digital conversion system to take account of the aforementioned prior amplification. The details of this process will be described in connection with FIG. 3. For present purposes, it need only be understood that the signal which the analog to digital converter system can provide through its output cable is a digitally-represented signal having a value essentially equal to the value of the instantaneous sample divided by the multiplication factor.

It has been found convenient and efficient to have this digitally-represented signal take the form of a 16-bit, 2's complement binary representation. A typical example of such a signal, expressed in terms of conventional binary coding, might be 0010100000000000. According to the 2's complement numbering system, the first zero is indicative of a plus sign; the next zero carries a value of $0\times(\frac{1}{2})$; the first 1 carries a value of $1\times(\frac{1}{4})$; the next zero carries a value of $0\times(\frac{1}{8})$; and the next 1 carries a value of $1\times(1/16)$. The remainder of the code represents $0\times(1/32)+0\times(1/64)$, etc., having therefore no effect on the value represented by the code. Thus, the signal in total has a value of $\frac{1}{4}+1/16 = +(5/16)$. As will be more fully explained below, in the present system this indicates that the value of the signal received by the analog to digital conversion system 26 from the low pass filter 24 at the time of the holding of a sample by the sample and hold circuit 30, was five-sixteenths of a maximum value which the analog to digital converter in the analog to digital converter system is designed to accept. The analog to digital conversion system, and further aspects of the above, are considered in more detail in connection with FIG. 3. However, for the present the above provides a sufficient basis for appreciating the system of FIG. 1.

In this regard, it should be noted that in the system of FIG. 1, a digitally-represented signal provided by the analog to digital conversion system is in fact a set of signals, one per digit. Such a signal, or signal set, is in fact treated as a unit by the computation apparatus CP, thus conveniently referred to, according to conventional terminology, as a digitally-represented signal. Also in this regard, components of the computation apparatus receive and transmit the signals in the signal sets upon which the components perform operations, at the same time (in parallel) rather than one at a time (in serial fashion). Similarly, the communication of other digitally-represented "signals" in the system of FIG. 1 is in general in signal sets, one set for each signal, similarly treated as units. Exceptions, of course, include the control signals from the control unit, the clocking signal C, the holding signal H and the reset signal R. A system similar to that of FIG. 1 could, however, be implemented using the serial technique. In connection with the more detailed description of the analog to digital conversion system and a digital to analog conversion system 36, deferred for the present, it will become useful to consider the individual signals which form a digitally-represented signal set of the type referred to.

By reference to FIG. 1, it can be seen that a digitally-represented signal from the analog to digital conversion system 26 can be provided directly to the adder A in the computation apparatus, to the multiplier M in the computation apparatus through a first bidirectional data buffer 32, and to the delay memory D in the computation apparatus through a second bidirectional data buffer 34. Information flowing into these buffers toward the multiplier and delay memory will pass through the buffers unimpeded. However, information from the multiplier and delay memory will only be passed by these buffers during intervals in which the control signals MT and DT, respectively, to these buffers are high. In this fashion, the data buffers, in certain respects, act to control the flow of information in the computation apparatus. By reference to FIG. 1, it may also be appreciated that a digitally-represented signal from the analog to digital conversion system 26 can, if desired, be passed directly to the digital to analog conversion system 36 for reconversion to an analog representation under the general control of a control signal CR. This would avoid any computation apparatus operations on the digitally-represented signal from the analog to digital conversion system.

Figure 2:
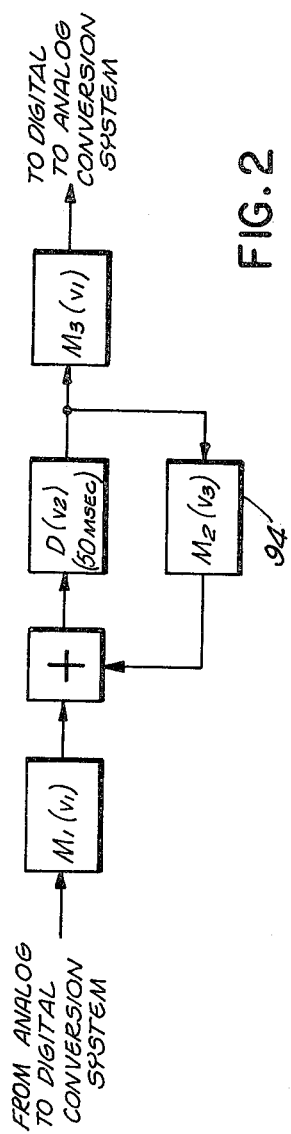
FIG. 2 is a diagrammatic representation of a particular process which may be carried out by the system of FIG. 1.

Addressing the controller aspects of the system of FIG. 1, a program encoder 38, electrically coupled to program selectors (not shown), provides a digital signal representing which one of several programs has been selected for implementation by the system of FIG. 1, over a program selector cable 40, to the control memory 12. This signal, along with a series of digital signals provided by a program counter 42 over a program counter cable 44, together form a series of address signals, which cause a sequence of control memory storage locations to provide the signal-represented information they contain over a first control memory cable 45. As implemented, it, for example, has been found satisfactory to utilize for the control memory function, a read only memory (ROM) in integrated circuit form, having 512 storage locations for storing program information representative of up to four different programs, which programs, of course, represent processes (e.g., as illustrated in FIG. 2). Thus, a first program might be stored as a sequence of words starting in a "zeroeth" storage location and ending in the 127th storage location, or a prior location. Similarly, a second program might be stored in the form of 128 words or less, starting with the 128th storage location, etc. In the system of FIG. 1, which is adapted to such a program configuration, the program encoder 38 provides two address bits which define which of four such sequences of storage locations is currently being utilized, by controlling which of the four portions of the control memory is being addressed. At the same time, the program counter counts in a standard seven-bit representation (forming with the two program encoder bits a nine-bit address count), at the rate of one count per clock pulse from the clocking unit 16, to address successive storage locations in one of the four portions of the control memory. After the final storage location for a program is reached (the 128th storage location in a sequence, a last group of which may be "empty"), the program counter 42 will automatically return to zero and start counting again. If there has been no change in the address bits received from the program encoder, the just-completed previous program will be repeated. However, if there has been a change, a new program in accordance with the change will be carried out. If, for some reason, a new program is selected while the program counter is in the middle of a count, it is evident that an immediate change in the address bits provided by the program encoder would be undesirable, as it would result in a jump from an intermediate point in one program to an intermediate point in another program. Thus, although the program selectors can select a new program while the program counter is in the middle of a count, the address bits provided by the program encoder can only be changed in accordance with this new selection upon the occurrence of a high pulse along a normally low reset signal R provided by the program counter 42. This pulse is provided when the program counter reaches the end of a count and resets to zero. If a new program selection has not been made, the pulse will result in no change in the address bits provided over the program selector cable 40.

As a typical illustration, it might be assumed that a second program in storage locations identified as locations 128 through 255 is to be implemented. The program selectors will then be configured to select the second memory portion; and the program encoder would provide the eighth and ninth bits in a nine-bit address, the eight bit being a 1 ("high"), representative in the standard binary number system of the number 128, and the 9th bit being a 0 ("low"). The program counter 42 will then count, and represent this counting, in the least significant seven address bits. The counter would start at 0, go to 1, 10, 11, etc. up to 1111111. This final group of digits of course represents the number 127 in standard binary, and with the one in the eighth digit position, represents the number 255, or the last storage location for the second program.

As storage locations in the control memory 12 are addressed, part of the information in each location is provided over a first control memory cable 45 to the control unit CU. As indicated by the number of control signals provided by the control unit and the prior description of the operation of the control unit, this would be thirteen bits of signal-represented information, which are accepted by the control unit along the rising edge of a clock pulse and stored until the rising edge of the succeeding clock pulse, when a new storage location in the control memory will have been addressed and new control signals will be present on the first control memory cable 45. In FIG. 1, thirteen bits of each storage location would then be dedicated to the storage of signal-represented control information. However, in accordance with variations, this number could be different. For example, for a system including a second multiplier and a second digital to analog conversion system, sixteen bits might be dedicated to control information. The implementation of such alternatives are easily appreciated from the system of FIG. 1.

As shown in FIG. 1, a second control memory cable 46 provides signals from other bit positions in an addressed storage location to an address register 50, and a third control memory cable 52 provides still other signals from other bit positions to a pre-address adder 54. In the system of FIG. 1, the adder 54 receives four bits of information through each of its input cables and provides a four-bit digital sum signal through a pre-address adder cable 60, the four bits being the four least significant bits. Variations may, of course, readily be implemented. Along these same lines, five bits of an addressed control memory storage location, for use as operand memory address information, are provided to the address register 50 through the second control memory cable 46, which, with the four bits from the pre-address adder 54, provides a total of nine address bits for storage in the address register 50, these numbers again being subject to rather easily and straightforwardly implemented variation.

The address register 50, which may readily be implemented as a number of distinct devices for storing single bits of signal-represented information under the control of the clocking signal C, along the lines previously discussed for the control unit, is, as shown in FIG. 1, synchronous with the control unit. Thus, its output signal, provided over an address register cable 62, becomes equal to the address signal on its input cables along the rising edge of a clock pulse, and remains unchanged until the rising edge of the next clock pulse.

In the system of FIG. 1, it is assumed that within a general process defined by a program, which is to be implemented by the apparatus, three groups of variables essentially complete the specification of the process. For example, for a program which processes digitally-represented signals representative of a sound signal, so that the sound signal will sound as though its source were in a room, these three groups of variables might be characterized, along lines previously discussed, as a "room size" group, a "reverberation time" group and a "high frequency damping" group. In this regard, the room size group would be generally representative of a room size that is being simulated, the reverberation time group would be generally representative of the general absorption characteristics of the room's walls and contents—i.e., of how long the echoes from a source retain significant "loudness"; and the high frequency damping group would be generally representative of how much faster the echoes from "high" frequency sounds decay than those for "low" frequency sounds. Thus, a variable selector for the room size group might be set to a position generally representative of a room that is box-shaped with a length, height and width of, e.g., 5, 10, 50 or 100 feet, etc.; a selector for the reverberation time group might set to a position generally representative of a reverberation time of 1, 2, 8 or 10 seconds, etc.; and a third selector might be set to cause the volume of "high" frequency signals (e.g., generally between 1 and 8 kilohertz) to decay two, three, five or 10 times, etc., as fast as "low" frequency signals. The room size selection might then be implemented by causing the selection to specify a number of signal delay intervals in the general process defined by the program; the reverberation time might be implemented by causing it to specify a number of multiplication factors (less than one) for multiplication operations provided for by the general process; and the high frequency damping selection might be implemented by causing it to specify other multiplication factors for other multiplication operations which are provided for by the structure of the program. Of course, having three groups of variables is merely illustrative. Thus, additional variable groups could be provided, e.g., a fourth "low frequency damping" group.

With reference to controller apparatus for implementing the concept of variable groups, and for example three such groups, in FIG. 1 an encoder for variables 64 receives electrical signals representative of selections for three groups of variables (e.g. room size, reverberation time and high frequency damping), and through a variable encoder cable 66, provides three digital signals representative of a selection for each of the groups, to an encoded variable selector 67. Where an encoded variable selector cable 68 therefrom carrier four bits of information, as indicated above, a selection for each group specifies four information bits. For example, a room size setting indicative of the 5-foot room might be coded as 0000; a setting representative of the 10-foot room might be coded as 0001, etc. Similarly, a reverberation time setting representative of 1 second might be coded as 0000; a setting representative of 2 seconds, by 0001, etc. However, for a given setting for each group of variables, the four bits will be defined and unchanging. Further, by analogy with the interaction of the program counter 42 and the program encoder 38, even if one or more variable group selections are changed in the middle of a traversal of control memory storage locations for a program, the encoded representation of the selections, received by the encoded variable selector 67, will not change until after the end of the program is reached, as indicated by a high pulse along the normally low reset signal R.

Pursuing this, as a program implementing a process is being carried out, control signals V1, V2, and V3 can be high, one at a time, during intervals defined by the leading edges of successive clock pulses. Then, during each interval when, e.g., the control signal V2 is high, the encoded variable selector cable 68 will carry a signal corresponding to the code for the second variable group selection. With a four-bit code for each variable group selection as well as for the signals provided along the third control memory cable 52, the pre-address adder 54, during such an interval, will, as indicated above, have a four-bit output corresponding to the four least significant bits of the sum of the code for the second variable group selection and what is in effect also a code provided along the third control memory cable 52. Thus, if at a given point in a program, e.g. corresponding to storage location 237, the signal-represented code provided through the third control memory cable is e.g. 1001, and the control signal V2 is high, providing e.g., the signal-represented code 0000 for the second variable group selection, the pre-address adder 54 will provide the signal-represented address code 1001, defining four address bits for receipt by the address register 50. If, alternatively, the variable selector for the second group had been set to provide the signal-represented code 0001, then at this same point in the program (storage location 237 in the control memory), the address signal would, alternatively, carry the address code 1010. The five-bit signal along the second control memory cable 46 would, of course, be the same in either case at such point. In FIG. 1, these five bits are the leftmost. Assuming, by way of example, that they are the signal-represented code 10000 for storage location 237, then the alternative addresses for operand memory storage locations at the same point in the program would be 100001001 and 100001010. Further, translating this from a standard binary representation for the address, to a decimal representation, the first alternative, when provided over the address register cable 62, would cause an operand memory storage location number 265 to be addressed, and the second alternative, a storage location number 266. Assuming, again by way of example, that each of these locations contains a different multiplication factor to be received and employed by the multiplier M (e.g., 0.6 and 0.5), one can then appreciate how different operands for the multiplication operation may be provided to the computation apparatus by the controller apparatus, at equivalent points in a program. As with the control memory function, a read only memory (ROM), in integrated circuit form, having 512 storage locations has, for example, been found to be a satisfactory implementation of the operand memory function.

The principles of the implementation of varying delay intervals within a general process defined by a program can be understood, with reference to the above discussion, when it is appreciated that the variation of such delay intervals can be accomplished by the manipulation of addressing information which is provided by an address adder 70 to the delay memory D through an address adder cable 72. The details of this and of the operation of an address counter 74 and an address offset register 36, in accordance with these principles, will be considered in conjunction with FIG. 2. Along more general lines, the address counter 74 increases its total count by one count per program sequence upon receipt of a pulse along the reset signal R; and the address offset register receives signal-represented address information from addressed storage locations in the operand memory over a first operand memory cable 78. The addressing of these storage locations is controlled according to the above-described mode of operation. In this regard, a given operand memory storage location will not contain both information representative of a multiplication factor to be received by the multiplier M over a second operand memory cable 80, and address information for the address offset register 76. Before this and FIG. 2 are considered in detail below, it will be valuable to provide a glossary of the control signals, as follows:

| Signal | Element to Which Provided | Functional Description Summary |
|---|---|---|
| V1 | Encoded Variable Selector | Selector transmits signal-represented code for first variable group while signal is high |
| V2 | Encoded Variable Selector | Selector transmits signal-represented code for second variable group while signal is high |
| V3 | Encoded Variable Selector | Selector transmits signal-represented code for third variable group while signal is high |
| AOR | Address Offset Register | Register stores input signal along falling edge of control signal |
| DR | Delay Memory | Delay memory stores input signal along rising edge of delayed control signal |
| DT | Delay Memory and Second Bidirectional Data Buffer | Delay memory transmits through buffer while delayed signal is high |
| MR | Multiplier | Multiplier and multiplicand registers in multiplier store input signals along falling edge of control signal |
| MT | Multiplier and First Bidirectional Data Buffer | Product register in multiplier transmits product signal through buffer while signal is high |
| AR | Adder | Addend register in adder stores addend signal along falling edge of control signal |
| AS | Adder | Adder receives augend signal while control signal is high; sum register in adder stores sum signal along falling edge of control signal |
| AT | Adder | Sum register in adder transmits sum signal while control signal is high |
| CT | Analog to Digital Conversion System | System transmits output signal while control signal is high; control signal commences process of creation of next output signal |
| CR | Digital to Analog Conversion System | System stores input signal along rising edge of delayed control signal |

With regard to the control signal MR, it is also noted that the multiplier M of FIG. 1 generates a high pulse along an internal signal which might be designated MP, which causes a multiplication to occur in the multiplier beginning with the onset of the clock pulse after that responsible for the high pulse along the MR signal, which multiplication is completed prior to the onset of the succeeding clock pulse. This multiplication, carried out on a signal-represented multiplier and multiplicand, in internal multiplier and multiplicand registers, provides the signal-represented product in an internal product register. (It might be noted that in the system of FIG. 1, a "subsequent" high interval along the control signal MR cannot coincide with the high interval along the control signal MP.) In this regard, a multiplier which can carry out a multiplication in a time range of approximately 325 nanoseconds or less, is well-suited to the system of FIG. 1.

With regard to the control signals V1, V2 and V3, control signals serving analogous functions, in conjunction with decoding circuitry in the encoder for variables 67, could be implemented by devoting two signals to a two-bit coding scheme for the three variables, and the third bit to a control signal which would cause the encoded variable selector 67 to transmit only while it is high. Variations such as this are, of course, easily implemented.

FIG. 2 is a diagrammatic representation of an illustrative process which may be carried out by the system of FIG. 1. It is employed herein to illustrate the principles of the apparatus of FIG. 1 in more detail. Referring to FIG. 2, and appreciating that the arguments $V_1$, $V_2$ and $V_3$ therein represent dependence upon a setting for first, second and third variable groups and that "M" represents a multiplication and "D" represents a delay, the process of FIG. 2 is easily understood. Thus, a digitally-represented signal from the analog to digital conversion system 26 is multiplied by the factor "$M_1$" to provide a multiplied input signal. A sum signal is produced by adding the multiplied input signal to a delayed sum signal multiplied by "$M_2$". The delayed sum signal was created by delaying a prior sum signal. The delayed sum signal is also multiplied by the multiplication factor "$M_3$", and this multiplied signal is transmitted to the digital to analog conversion system 36. Thereafter, the next digitally-represented signal from the analog to digital conversion system is received and multiplied by "M₁"; the next delayed sum signal is multiplied by "M₂"; a new sum signal is produced; and the aforementioned next delayed sum signal is multiplied and transmitted, as the signal processing continues. As indicated previously, the digitally-represented input signals would have values essentially equal to the values of the analog signal received by the analog to digital conversion system 26, at the successive instants at which the sample and hold circuit 30 holds discrete values of the analog signal which it receives. Similarly, the output signals to the digital to analog conversion system 36 would be a succession of digitally-represented signals, representative of the analog signal received by the analog to digital conversion system, as processed according to FIG. 2.

The delay interval D in FIG. 2 is conveniently implemented in terms of the number of successive inputs to the diagrammed process of FIG. 2 corresponding to the delay interval, as follows.

According to a well-understood principle of analog to digital and digital to analog conversion (Nyquist's Theorem), successive samples of an analog signal must be taken at a rate equal to at least twice the frequency of the highest frequency component of the analog signal in order to preserve the information in that analog signal. As previously indicated, and referring to FIG. 1, a low pass filter 24 having a cut-off frequency of approximately 8 kilohertz is conveniently employed. Similarly, it has been found convenient and useful to employ a sampling rate of, and thus provide analog signal samples at the rate of, three rather than two times this 8 kilohertz frequency, or 24,000 samples per second. Variations in the cut-off frequency, and the sampling rate are of course possible.

Carrying this sampling rate over to the particular process of FIG. 2, the system will receive a digitally-represented signal corresponding to an analog signal sample, and typically go through a sequence encompassing each of the processing steps described, at a rate of 24,000 times per second, equal to the sampling rate. Applying this to the implementation of a delay interval, a delay of "I" milliseconds corresponds to $I(24,000/10^3)$ samples (the $10^3$ being a result of the use of milliseconds). Thus, to implement a delay of 50 milliseconds, the output corresponding to a given input signal (multiplied by "M₁", summed, delayed by "D", then multiplied by "M₃") must occur after approximately 1200 input signals have followed.

For the purpose of illustrating the application of the system of FIG. 1 to the particular process of FIG. 2, a number of additional characteristics of the apparatus will be noted, and a number of assumptions will be made, which can readily be varied. First of all, in keeping with previously described characteristics, the address register cable 62 carries nine bits of addressing information for addressing the operand memory 14. Along these same lines, each storage location in the operand memory contains 16 digit positions. The information in these positions, in order to implement a process, might be reprsentative of a multiplication factor for provision to the multiplier M over the second operand memory cable 80. Alternatively, the information in 14 (the least significant 14) of the digit positions in such a location may be addressing information for provision to the address offset register 76 over the first operand memory cable 78 (two digit positions being truncated in the transmission process). The number represented by this information would then be added to the number which the address counter 74 has reached to provide, along the lines of the pre-address adder 54, a 14-bit address signal (any 15th, most significant bit being truncated) for the delay memory D over the address adder cable 72. Delay memory addressing information is assumed to be translatable, according to standard binary representation, to a number for a storage location. Thus, a storage location in the delay memory designated by the number 512 would have the address code 00001000000000. Similarly, the storage location designated by the number 1712 would have the address code 00011010110000. In the illustration, the signal-represented first such address code is arbitrarily assumed to be stored at a storage location in the operand memory having the address code 100001010, and the second code in a storage location in the operand memory having the address code 100111101. It is similarly arbitrarily assumed, for purposes of the illustration, that the signal-represented binary representation for a chosen multiplication factor M₁ (e.g., 0.6) is stored in the operand memory storage location having the address code 110000010, and that the analogous address codes for the storage locations for similarly chosen multiplication factors M₂ and M₃ are 011011110 and 001000110. In the system of FIG. 1, the computation apparatus is adapted to operate in a 2's complement (binary) format. Thus, the representations for these multiplication factors would follow that format.

In the illustration, and according to a memory configuration and addressing mode previously noted, the information in the control memory to implement the process of FIG. 2 is assumed to be located in a third portion of a 512-word memory having room for 128 words per portion. In this regard, the first storage location of interest will be the 256th location having an address code of 100000000. This corresponds to the selection of program 3 by the program selectors, encoded as 10 by the program encoder 38, and a count of 0000000 in the seven-bit program counter 42. As indicated previously, the count over the program counter cable will increase by one for each clock pulse. Also, the program counter reset mechanism will reset the count to zero after 128 counts. For the simplified illustration of FIG. 2, an exemplary program which will be given below, occupies 12 storage locations. The counter would then traverse the remaining 116 locations, which would be "empty".

The exemplary program is in the form of the information contained in control memory storage locations 256 through 267. For each of the storage locations, the control information which is to be provided to the control unit is expressed as the designation of which control signals this control information will cause to be high starting on the leading edge of the clock pulse after that storage location has been addressed. Further, the stored information for the address register is represented as a five-bit code, the five leftmost bits of an operand memory address code; and the stored information for the pre-address adder is represented as a four-bit code for, in effect, addition (with a possible truncation) to the signal-represented code provided over the encoded variable selector cable 68. (This type of interaction could also, e.g., be implemented with a nine-bit pre-address adder, nine address bits going from the control memory 12 to the pre-address adder, and the elimination of a direct connection between the control memory and the address register 50.) It is again preliminarily noted that the control information in a storage location is provided by the control unit CU starting on the rising edge of the next clock pulse after that storage location is addressed. This delay, however, does not occur with respect to the clocking interval in which the other information in the storage location becomes effective. With this in mind, and with the understanding that the symbol "--" indicates that no information is needed or used by the system, an exemplary program for the process of FIG. 2 is as follows:

| Storage Location | Control Information | Information for Address Register | Information for Pre-Address Adder |
| --- | --- | --- | --- |
| 256 | V1 high | — | — |
| 257 | CT, MR, V2 high | 11000 | 0010 |
| 258 | AOR high | 10000 | 0010 |
| 259 | MT, AR, V3 high | — | — |
| 260 | MR, DT, V2 high | 01101 | 0000 |
| 261 | AOR high | 10011 | 0101 |
| 262 | MT, AS high | — | — |
| 263 | DR, AT, V2 high | — | — |
| 264 | AOR, V1 high | 10000 | 0010 |
| 265 | DT, MR high | 00100 | 0110 |
| 266 | All low | — | — |
| 267 | MT, CR high | — | — |

Given this program, and for the previously noted operand memory address codes for the storage locations containing $M_1$, $M_2$ and $M_3$ and containing the information for addressing storage locations 512 and 1712 in the delay memory, only the signal-represented code for each of three variable groups (represented by the arguments $V_1$, $V_2$ and $V_3$ (see FIG. 2)) is needed. They are, of course, defined by the variable selector settings (see FIG. 1), and are, respectively, carried over the encoded variable selector cable 68 when the control signals V1, V2 or V3, respectively, are high. In this case, settings resulting in the following signal-represented codes must be made: for the first group—0000; for the second group—1000; and for the third group—1110.

Referring to the above table, FIG. 1 and FIG. 2, one sees that, prior to the first clock pulse, signals together representing the address of control memory storage location 256 will be provided over the program encoder cable 40 and the program counter cable 44. At the onset of the first clock pulse, control signal V1 will go high, providing the signal-represented code 0000 over the encoded variable selector cable 68. That code, along with the signal-represented code 0010 provided from digit positions in storage location 257 having information for the pre-address adder, will be added by the pre-address adder to provide the signal-represented code 0010 over the pre-address cable 60. Thus, prior to the onset of the second clock pulse, the signal-represented code 11000 from digit positions in storage location 257 having information for the address register, along with the signal-represented code 0010, will be provided at the input to the address register 50. Along the rising edge of the second clock pulse, this register will accept and store this input information, providing the signal-represented address code 110000010 to the operand memory 14 over the address register cable 62 during this second interval. As a result, information from the operand memory storage location having the address code 110000010 will be provided in signal-represented form along the second operand memory cable 80 (as well as the first operand memory cable 78) prior to the end of the second clocking interval.

Returning to the (first) clocking interval commencing with the onset of the first clock pulse, storage location 257 will be addressed during this interval, providing input signals to the control unit which will cause control signals CT, MR and V2 to be high during the second clocking interval.

Proceeding with the second clocking interval, the aforementioned information from the operand memory storage location having the address code 110000010 is the multiplication factor $M_1$. Thus, prior to the end of this interval, the multiplier register in the multiplier M will be provided with a signal at its input, representative of the first multiplication factor $M_1$. Along similar lines, during this clocking interval, due to the "CT high" to the analog to digital conversion system 26, the analog to digital conversion system will present, along its output cable, a signal representative of a value of the analog signal which the analog to digital conversion system is receiving. As a result, the multiplicand resister in the multiplier M will be provided with a signal, from the analog to digital converter, at its input during this clocking interval. Thus, when the pulse along the control signal MR falls, at the end of the interval, the multiplicand and multiplier registers will accept and store the indicated input information for later multiplication. There are a number of additional occurrences during this clocking interval. First of all, a high signal along the control signal V2 (resulting from the "V2 high" in control memory storage location 257) will result in the transmission of the signal-represented code 1000 over the encoded variable selector cable 68; and, along lines previously discussed, the pre-address adder cable 60 will transmit the signal-represented code 1010 from the pre-address adder, to form with the signal-represented contents of the digits of storage location 258 in the control memory having information for the address register, the signal-represented code 100001010 at the input to the address register 50.

During the third clocking interval, along the rising edge of the clock pulse commencing this interval, the address register 50 will accept and store this signal-represented code, causing the information in the operand memory storage location having the address code 100001010 to be provided over the first operand memory cable 78 (as well as the second operand memory cable 80) prior to the end of the interval. Thus, along the falling edge, at the end of this interval, of the pulse along control signal AOR, the address offset register 76 will accept and store the information that is in the aforementioned storage location. As indicated previously, it is assumed that the signal-represented address code 00001000000000, representative of the number 512, is stored therein (in the 14 right-most digit positions, of a total of 16). Thus, this signal-represented address code will be stored in the address offset register 76. Also during this clocking interval, the multiplier M will, as a result of the generation of a high pulse along the internal signal MP, in effect carry out the multiplication of $M_1$ times the value of the stored input signal from the analog to digital conversion system, as in FIG. 2, and store the signal-represented result in its internal product register.

During the fourth clocking interval, due to the "MT high" in control memory storage location 259, the product register in the multiplier will transmit this aforementioned signal-represented product, which will be accepted and stored by the addend register in the adder A along the falling edge of the "AR high" pulse, which will coincide with the end of the interval. Along lines previously indicated, the "V3 high" in control memory storage location 259, along with the information for the pre-address adder and for the address register in control memory storage location 260, will cause the pre-address adder cable 60 to carry the signal-represented code 011011110 prior to the end of the fourth clocking interval. This is, of course, the address code for the operand memory storage location for the signal-represented multiplication factor $M_2$.

With the onset of the fifth clocking interval, along the rising edge of the clock pulse, this address code will be accepted and stored in the address register 50, causing the signal-represented multiplication factor $M_2$ to be presented to the multiplier register in the multiplier prior to the end of this interval. Also, starting along a delayed rising edge, due to the "DT high" in control memory storage location 260, the signal-represented contents of the delay memory storage location having the address code 00001000000000 (storage location 512) will be transmitted by the delay memory through its output cable and through the second bidirectional data buffer 34 to other elements, including the adder A, the multiplier M (through the first bidirectional data buffer 32) and the digital to analog conversion system. (By reference to FIG. 1 and previously discussed matters, it is evident that the control signal DT must be provided to the second bidirectional data buffer, to cause it to transmit away from the delay memory.) It is noted that this address code was derived from the sum of the number represented by the contents of the address offset register (512), as noted above, and the number represented by the contents of the address counter, which will be zero, as this is the first pass through the relevant control memory storage locations. As a result of the above and of the "MR high" in storage location 260, the multiplier register in the multiplier will accept and store the signal-represented second multiplication factor $M_2$, and the multiplicand register will accept and store the signal-represented contents of delay memory storage location 512, at the end of this clocking interval. In addition, prior to the end of this clocking interval, according to principles already described, the second control memory cable 46 and the pre-address adder cable 60 will provide the signal-represented address code 100111101 to the address register 50.

After the passage of an interval following start-up, a delay memory storage location such as the aforementioned storage location 512 will generally contain information of interest. However, a number of passes through the storage locations for the program are required before useful information is developed at that point in the process. This is addressed in more detail below. For convenience, this information will be generally designated herein as D(512).

Proceeding to the next clocking interval, the multiplier M will, as a result of the generation of a high pulse along the internal signal MP, in effect carry out the multiplication of $M_2 \times D(512)$. Further, along the rising edge of the clock pulse commencing this interval, the address register 50 will accept and store the signal-represented address code 100111101, providing the address offset register with (in the right-most 14 of 16 digit positions) the signal-represented code 00011010110000. This signal-represented code will be accepted and stored by the address offset register at the end of the interval, resulting, with the zero count in the address counter 74, in the presentation to the delay memory of the signal-represented address code 000011010110000 (for delay memory storage location 1712) along the address adder cable 72.

During the seventh clocking interval, as a result of the "MT high" in control memory storage location 262, in effect the product $M_2 \times D(512)$ will be transmitted by the product register in the multiplier M through the first bidirectional data buffer 32. Due to the "AS high" in this same storage location, the adder A will receive this product information as an augend during the clocking interval; and at the end of the interval, along the falling edge of the pulse along the control signal AS, the sum register in the adder will accept and store in effect the sum $M_1 \times$ (the value of the input signal) $+ M_2 \times D(512)$. The "AT high" and "DR high" in control memory storage location 263, along with the previously described addressing information (for addressing delay memory storage location 1712) which is being provided to the delay memory, will cause this signal-represented sum to be stored in operand memory storage location 1712 during the next clocking interval.

Along lines previously discussed, the "V2 high" in control memory storage location 263 (operative during this next clocking interval), along with the "AOR high" in control memory storage location 264 and the address register and pre-address adder information in this storage location, will again cause operand memory storage location 512 to be addressed prior to the onset of the clocking interval in which the "DT high" in control memory storage location 265 is provided to the delay memory. Similarly, prior to the end of such interval, during which the "MR high" is also provided to the multiplier, the "V1 high" in control memory storage location 264 and the address register and pre-address adder information in control memory storage location 265, will cause the signal-represented third multiplication factor $M_3$ to be presented by the operand memory to the multiplier register. Thus, along the falling edge of the pulse along the control signal MR, the multiplier register will accept and store this signal-represented multiplication factor. Similarly, the multiplicand register will accept and store the signal-represented information D(512).

During the clocking interval after this storage occurs, the multiplier M will carry out in effect the multiplication of $M_3 \times D(512)$. Then, during the following clocking interval, as a result of the "MT high" in control memory storage location 267, in effect $M_3 \times D(512)$ will be provided in signal-represented form by the product register through the first bidirectional data buffer for possible acceptance and storage by various elements. The "CR high" in control memory storage location 267 indicates that during this clocking interval, along the delayed rising edge of the control signal CR, in effect $M_3 \times D(512)$ will be accepted and stored by the digital to analog conversion system 36 for further processing by it and use in generating an analog output signal.

By reference to the proceeding description, it may be appreciated that during the next traversal through the program, when the address counter 74 is at a count of one, the relevant delay memory storage locations will be storage locations 513 and 1713. Similarly, during the 1201st time through the program, when the address counter is at a count of 1200, the relevant storage locations will be storage locations 1712 and 2912. Thus, the contents of operand memory storage location 1712, which were stored during the first time through the program, just described, will in effect be provided for multiplication by M₂, and multiplication by M₃, etc. Thus, for the sampling rate of 24,000 samples per second, a 50 millisecond delay has been implemented. It will be evident that at any given time, 1201 storage locations must be reserved to implement this delay. Since a number of delays will normally be present in a program (or process), the total time of all the delays in effect determines how many storage locations must be included in the delay memory for the implementation of delays. In this regard, a random access memory (RAM) having approximately 8200 storage locations has been found to be satisfactory. However, the memory size can of course easily be altered in keeping with requirements.

Figure 3:
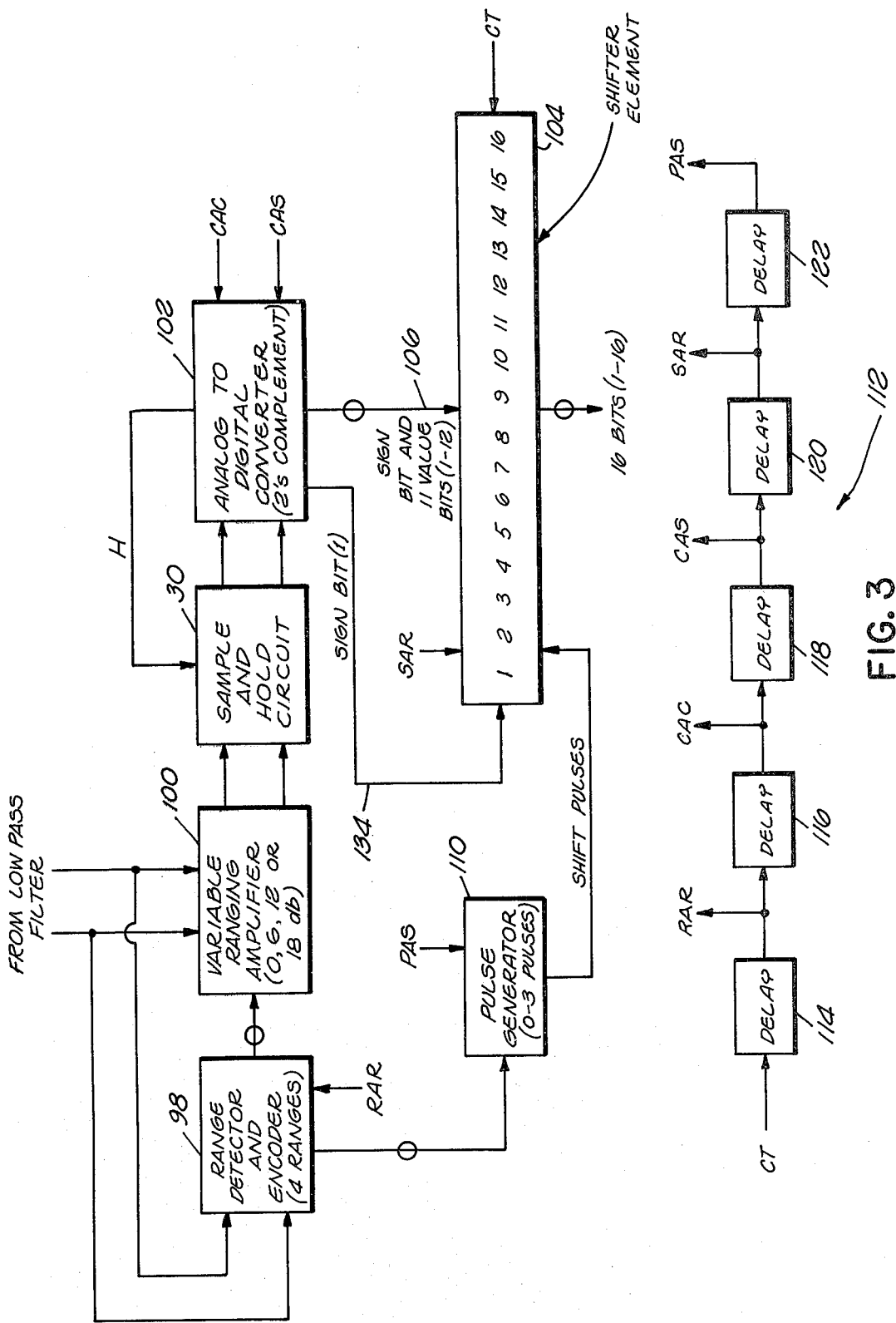
FIG. 3 is a block diagram showing in more detailed form, an analog to digital converter system more generally depicted in FIG. 1.

It might be noted with respect to the operation of the system of FIG. 1, as illustrated, e.g., by the process of FIG. 2, that the delayed effect of the control signals CR, DR and DT may be conventionally implemented in the internal circuitry of the digital to analog conversion system 36 and the delay memory D (see, e.g., FIG. 3). Also, with respect to the storing of input signals by various of the elements along falling edges of various control signals, essentially the same result could be accomplished by a variety of other techniques. By way of example, with reference to the addend register in the adder, a second clocking signal could be provided which rises with the signal provided by the clocking unit 16, but falls sooner. This signal could then be fed into a two-input "AND" gate, with the control signal AR going to the other input. The output of this gate could then be provided to an addend register which is triggered to accept and store information on a falling rather than a rising edge. The same second clocking signal could be similarly employed in conjunction with similar modifications in other elements of the system.

Figure 4:
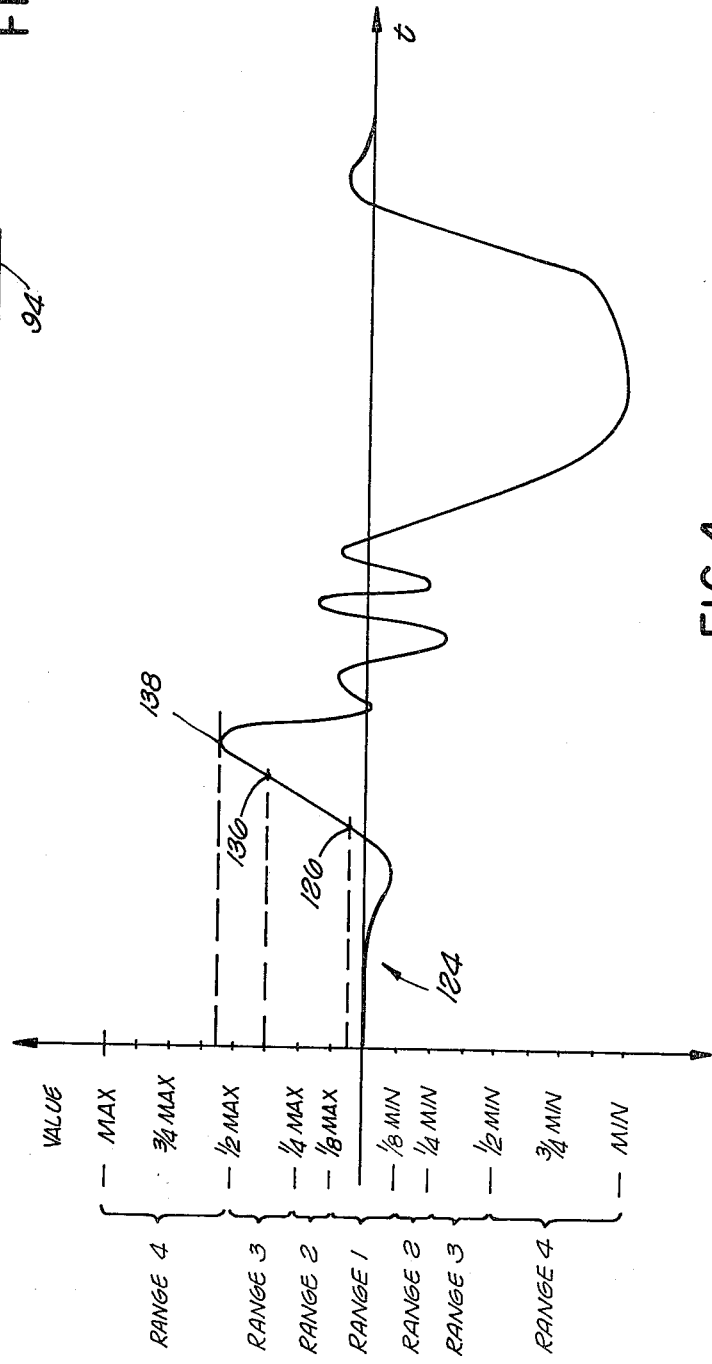
FIG. 4 shows an illustrative analog signal which might be received for processing by the analog to digital conversion system of FIG. 3.
Figure 5:
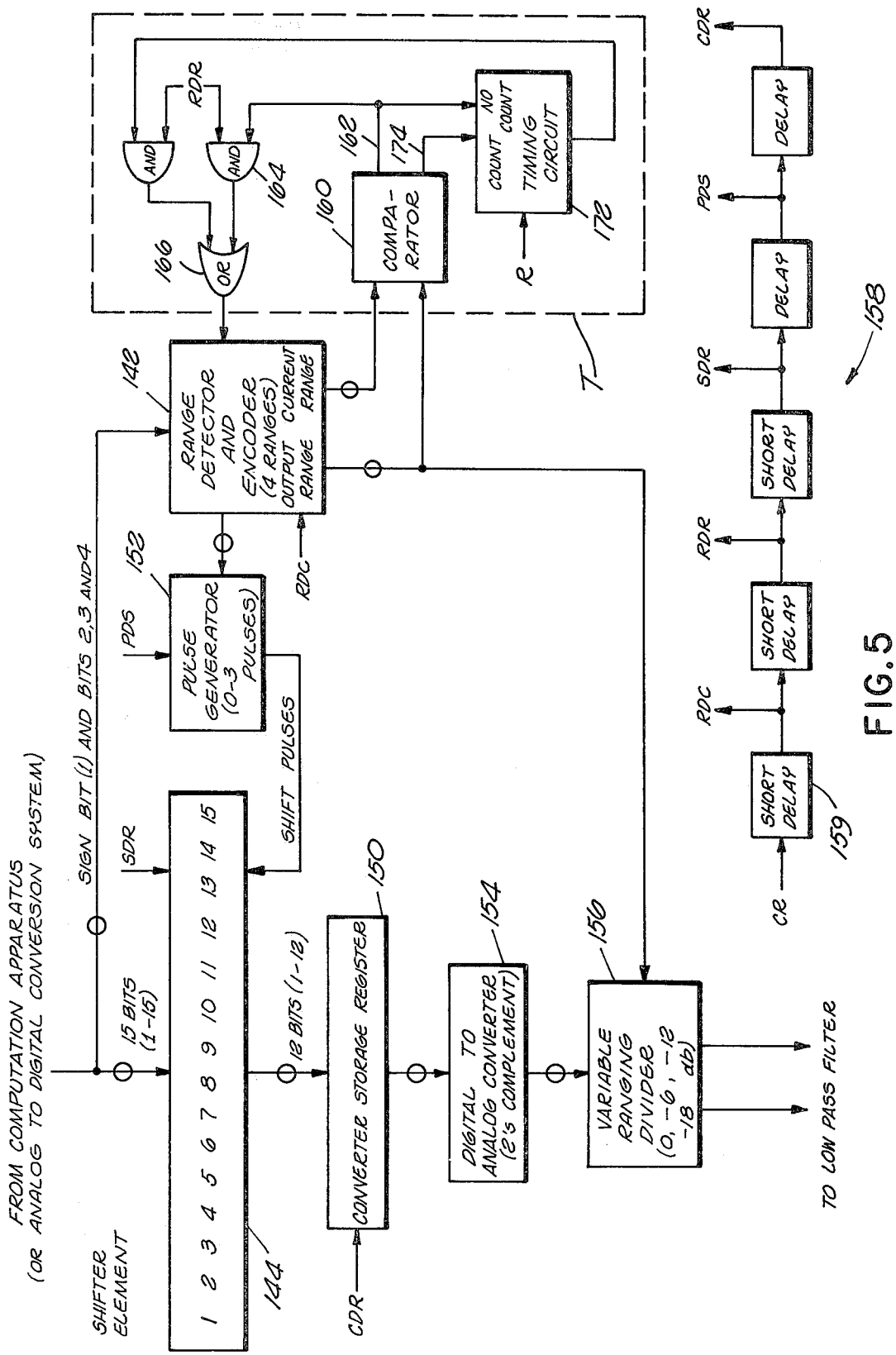
FIG. 5, is a block diagram showing in more detailed form, a digital to analog converter system more generally depicted in FIG. 1.

FIG. 3 shows, in more detailed form, the analog to digital conversion system 26 of FIG. 1 in association with the sample and hold circuit 30 of FIG. 1. FIG. 5 similarly shows, in more detail, the digital to analog conversion system 36, depicted generally in FIG. 1. Referring to FIG. 3, the analog signal from the low pass filter 24 (FIG. 1) is received by both a range detector and encoder 98 and a variable ranging amplifier 100. The range detector and encoder, as shown, has the capability to detect and encode four ranges, and the variable ranging amplifier has the capability to multiply the values of the analog signal by four different factors, at least in part dependent upon such values. As indicated, the particular factors are one (amplification by zero decibels), two (amplification by six decibels), four (amplification by 12 decibels) and eight (amplification by eighteen decibels). An illustrative analog signal which the range detector and encoder 98 and variable ranging amplifer 100 might receive from the low pass filter is shown in FIG. 4, in which the values of the signal are represented in terms of fractions of a maximum or minimum value which an analog to digital converter 102 is designed to receive and convert to a digital representation. A shifter element 104 is connected to receive a succession of digitally-represented output signals from the analog to digital converter over an analog to digital converter cable 106. Following acceptance and storage of such a signal, the shifter element can manipulate its stored, signal-represented information under the control of a pulse generator 110, which in turn is controlled by the range detector and encoder 98. Following this manipulation, the perhaps modified signal-represented information stored in the shifter element is ready for transmittal from the shifter element to other parts of the apparatus of FIG. 1 upon occurrence of a high pulse along the control signal CT. An internal "AND" gate with two input terminals, at the output of each of the shifter element's digit positions, which might receive the signal-represented information in the position in one terminal and the control signal CT in another terminal, could, for example, be utilized to implement this transmittal.

Before proceeding to a more detailed description of the operation of the analog to digital conversion system of FIG. 3, it will be useful to briefly review the 2's complement (binary) number system. In this regard, it is preliminarily noted that the various choices parenthetically indicated in FIG. 3 (as well as in FIG. 5) and in addition, the capacity of the shifter element in FIG. 3 (as well as in FIG. 5), are, of course, merely illustrative of broad principles of operation which may be employed in conjunction with readily apparent variations.

The 2's complement number system incorporates a representation of any given value as a fraction of a maximum value of $+1$, which, however, cannot be reached, or a minimum value of $-1$. Applying this, e.g. to an electronic system, the $+1$ and $-1$ are conveniently employed to indicate a design maximum (e.g., 5 volts) and a design minimum (e.g., $-5$ volts). Any given value is then represented as a first, left-most binary sign digit, which is zero for a plus sign and one for a minus sign. The remaining digit positions are value digits. In the familiar decimal number system, the value of each of these remaining digit positions is $(2)^{-n}$, where n is the position number, from left to right, assuming $n=1$ for the first value digit position. For a positive number, this information completely defines the value carried by the 2's complement representation. Thus, in a 15-bit 2's complement representation, the value $+\frac{1}{2}$ would be represented as $\underline{0}10000000000000$; and the value $+\frac{3}{8}$ would be represented as $\underline{0}01100000000000$. (The underlined digit is, of course, the sign digit.) However, where the value is negative, the just-defined value of the value digits, when totaled, must be subtracted from the value $+1$ in order to obtain the correct absolute value of the negative 2's complement representation. Thus, $\underline{1}10100000000000$ has a value of $-(1-(\frac{1}{2}+\frac{1}{8}))$, or $-(1-\frac{5}{8})=-\frac{3}{8}$.

By reference to the above, it will be appreciated that in order to divide the value represented by a two's complement representation by two, one must shift each of the value digits one position to the right, inserting a digit that is the same as the sign digit in the vacated position at the left. To maintain the 15-bit representation, the digit that previously occupied the 15th digit position would be truncated. Thus, $+(\frac{1}{2})/2$ is represented as $\underline{0}01000000000000$. Similarly, in order to divide by four, the shift would be two digit positions with the insertion of two zeros or ones, depending on the sign; and in order to divide by eight, the shift would be three digit positions with the insertion of three zeros or ones.

On the other hand, a multiplication by two, four or eight is accomplished by the reverse process, shifting to the left and removing successive digits which are next to the sign digit. In this regard, since a value greater than or equal to $+1$, or less than $-1$ cannot be reached in the 2's complement system, only multiplications resulting in values which are less than $+1$ and greater than or equal to $-1$ can be carried out. For example, for a representation having a positive value, if the first digit position after the sign digit is occupied by a one, one knows that a multiplication by two (or four, or eight) cannot be carried out. Similarly, if the first value digit is a zero, but the second digit is a one, a multiplication by two, but not by four or eight can be carried out. If the second and third value positions for the representation are occupied by zeros, but the fourth position is occupied by a one, then a multiplication by two or four, but not by eight, can be carried out. Thus, for a 2's complement representation having a positive value, one can determine from the sign digit and succeeding digits, the possible maximum value by which the value represented can be multiplied.

The multiplication situation with regard to 2's complement representations having a negative value is analogous, after the difference in the sign digit is taken into account. Thus, in order to determine a maximum value by which one can multiply, the digits after the sign digit must be tested for one's rather than zeros. These are all, of course, well-understood properties of the 2's complement number system.

Returning to the operation of the apparatus of FIG. 3, the control signals for the apparatus (apart from CT) are derived from a control unit 112 for the analog to digital conversion system. The input to this control unit is the previously discussed control signal CT which is received by the shifter element 104, and which, when high, causes a transmission by the shifter element of the signal-represented information it contains to other parts of the system of FIG. 1. First, second and third delay elements 114, 116 and 118 result in delays of the control signal CT by one clocking interval each. A fourth delay element 120 results in a delay which is long enough to permit the analog to digital converter 102 to undertake a complete conversion of a received analog signal sample to a digital representation. In order to permit adequate time, this delay may be a large portion of the interval between the rising edges of succeeding high intervals along the CT control signal, determined by the sampling rate (24,000 samples per second). A fifth delay element results in a delay of one clocking interval, as with the first three elements. A glossary of these control signals is as follows:

| Signal | Element To Which Provided | Functional Description Summary |
| --- | --- | --- |
| RAR | Range Detector and Encoder | Range detector and encoder stores encoded range along rising edge of signal |
| CAC | Analog to Digital Converter | Converter cleared along rising edge of signal; causes converter to send a pulse along the holding signal H |
| CAS | Analog to Digital Converter | Converter commences conversion process along rising edge of signal |
| SAR | Shifter Element | Shifter element stores input signal from converter along rising edge of control signal |
| PAS | Pulse Generator | Pulse generator transmits shift pulses when signal goes high |

With this background, the operation of the apparatus of FIG. 3 can be readily understood. The range detector and encoder 98, operating in conventional fashion, receives an analog signal and determines which of four ranges the values of the signal fall within. In this regard, the detector and encoder acts somewhat as a peak detector. It, in general, closely follows (detects) the absolute value of the analog signal along portions of increasing absolute value but does not closely follow the absolute value along portions having a decreasing absolute value. More accurately, it generally follows the decreasing absolute value along these portions, but at a certain decay rate, conventionally implemented in range detectors and encoders of this type using a capacitor and a resistor. A resistor and capacitor having a decay rate (resistance times capacitance) of 100 milliseconds is one typical choice, considered generally satisfactory.

The range detector and encoder internally provides a digital representation of one of four ranges indicated by its detection function. For example, and referring to FIG. 4 where an illustrative analog signal 124 is shown, the maximum and minimum possible values might be +4.8 (volts) and −4.8 (volts), where the analog to digital converter is designed to generally receive analog values within these limits.

Upon the onset of the high interval along the control signal RAR, the range detector and encoder will store in an internal range register, the digital representation of the range detected at the time of this onset. For example, referring to FIG. 4, if, at the time of storage, the analog signal is just prior to a first point 126, the range detected, and the encoded range that is stored, would indicate to the variable ranging amplifier 100 that the signal, which it also receives, should be multiplied by eight (amplified by 18 decibels); and the same encoded range would indicate to the pulse generator 110 that when it is enabled, it is to generate three shift pulses. Following the storage of an encoded range, along the rising edge of the control signal CAC, the analog to digital converter 102 will be cleared of old signal-represented information it contains. Further, upon the occurrence of this control signal, the analog to digital converter will transmit a high pulse along the holding signal H, which will cause the sample and hold circuit 30 to hold the value of the analog signal it is receiving from the variable ranging amplifier. Pursuing the example, for the first point 126, along the illustrative analog signal 124, this held value would be eight times the value of the signal at that point, or a value equal to one-half the maximum value.

Continuing the example, the control signal CAS to the analog to digital converter, which is a delayed version of the control signal CAC (and CT), will cause the analog to digital converter to start the conversion process on the value ½. Following completion of this process, the control signal SAR will cause the shifter element 104 to accept and store the 2's complement (binary) representation having a value equal to the value received by the analog to digital converter. For the indicated 12-bit 2's complement representation, the shifter element will contain the signal-represented code 010000000000 in its first twelve digit positions from the left, and four more zeros to fill out the sixteen positions. This, of course, is a 2's complement representation having the value ½. Following this, the pulse generator, which has stored information indicating that, when enabled, it is to generate three pulses, will, upon receipt of a high pulse along the control signal PAS, send three shift pulses in succession to the shifter element 104. In conventional fashion, the shift pulses cause a "rightward" shift of the signal-represented digits in the shifter element, with the signal-represented sign bit being received over a sign bit line and stored in the first digit position with each shift. It may be appreciated that the pulses result, in effect, in a division of the value of the 2's complement representation in the shifter element by $2^n$, where n is equal to the number of pulses. Thus, in the example, the resulting signal-represented code in the shifter element will be 0000100000000000. Thus, the correct value at the first point 126 (1/16) will be present in the shifter element, for transmittal to the remainder of the system of FIG. 1. This is a completely integrated representation, which accurately provides the value of the analog signal where it is sampled. It achieves the benefits of ranging (expanding the effective range of the analog to digital converter) without requiring the transmittal of separate encoded ranging information to the remainder of the system of FIG. 1. Sometime after this shifting process is completed, the succeeding high interval along the control signal CT will cause the information in the shifter element to be transmitted to the remainder of the apparatus of FIG. 1. As indicated previously and by the above, a digital signal received by the shifter element 104 and stored by the shifter element, according to a more detailed characterization, is a set of signals, one per digit position.

By reference to the above discussion and FIG. 4, it will be apparent that for a control signal RAR that occurs when the illustrative analog signal 124 is just prior to a second point 136, the multiplication will be by two, providing a value equal to three-fourths of the maximum value for this second point (assumed to be held by the sample and hold circuit) at the input to the analog to digital converter, and thus a first signal-represented code in the shifter element of 0110000000000000, and a second code of 0011000000000000. On the other hand, for a control signal RAR going high when the analog signal 124 is just prior to a third point 138, the multiplication will be by one, no pulses will be generated, and the second signal-represented code in the shifter element 104 will be the same as the first code.

It might be noted that the implementation of the function provided by the pulse generator 110 and the shifter element 104 of FIG. 3 may be achieved by using a group of "4-bit shifters" sold under the designation Am25S10. For the 16-bit requirements of the conversion system of FIG. 3, four of these shifters may be interconnected. In this regard, it may be convenient to, for example, provide for an inherent divide by eight followed by an indication of to what extent this inherent divide by eight must be reversed.

It will be apparent that benefits attendant to the apparatus of FIG. 3 are in principle applicable to the standard binary number system or other number systems (including the decimal system), and may be achieved using differing numbers of ranges and different multiplication factors. The multiplication by factors of two, however, is particularly adapted for use with the binary number system; and the use of a 2's complement binary representation is particularly adapted to use with computation apparatus, including, e.g. multipliers and adders.

The digital to analog conversion system of FIG. 5 is readily understood by comparison with and contrast to the analog to digital conversion system of FIG. 3. A second, different range detector and encoder 142 detects and encodes successive ranges for successive digitally-represented signals (signal sets, one signal per digit) generally received and stored at the rate of one per sampling interval by a second shifter element 144. A converter storage register 150 stores successive 12-digit signal sets resulting from the manipulation of 15 digits in the successive sets which are stored by the shifter element, the manipulation being in accordance with pulses from a second pulse generator 152. A variable ranging divider 156 divides values of the analog signal provided by a digital to analog converter 154, by a factor of one, two, four or eight, depending upon a digitally-represented code for one of four ranges which is stored in an output range register in the range detector and encoder. In addition, a timer T restricts changes in this stored, encoded output range in a fashion which will be explained in more detail below. However, before proceeding, it will be convenient to provide a glossary of the control signals provided by a control unit 158 for the digital to analog conversion system, as follows:

| Signal | Element To Which Provided | Functional Description Summary |
| --- | --- | --- |
| RDC | Range Detector and Encoder | A current range register in range detector and encoder stores encoded current range along rising edge of control signal |
| RDR | Timer | Output range register in range detector and encoder enabled to change encoded output range along rising edge of signal if other input to either of two (or both) "AND" gates is high |
| SDR | Shifter Element | Shifter element stores first 15 bits (from left) of 16-bit input signal set along rising edge of control signal |
| CDR | Converter Storage Register | Register stores first 12 bits of 15-bit signal set in shifter element along rising edge of control signal |
| PDS | Pulse Generator | Pulse generator transmits shift pulses when signal goes high |

As with the system of FIG. 3, the parenthetical information in FIG. 5 along with the number of bits which are employed is, of course, illustrative of principles which can be readily employed in conjunction with variations.

In the context of FIG. 1, the signals transmitted to the digital to analog conversion system will each be a digitally-represented 2's complement 16-signal set, having one signal for each of 16 digit positions, including a sign position. The 16th signal (far right) is not received by the system of FIG. 5, but truncated due to considerations which will become apparent. The first signal (sign bit), along with the second, third and fourth signals in each signal set are received by the range detector and encoder 142. As indicated previously, these four bits may be interpreted as indicating whether the value carried by the signal set can be multiplied by eight, or if not eight, by four, or if not four, by two, within the confines of the 2's complement number system. Thus, if all of these signals carry a zero code, the value is positive, and can be multiplied by eight; or if the first two signals carry a one code, but the third, a zero code, the value is negative and can be multiplied by two.

The range detector and encoder in accordance with this information, will internally provide a digitally-represented current range code, representing whether the four bits of information received indicate a multiplication by one, two, four or eight. This current range code is stored in an internal current range register triggered by the rising edge of the control signal RDC. This rising edge, as indicated by a first short delay element 159, will occur well within the clocking interval beginning along the rising edge of the control signal CR. On the other hand, the output range register in the range detector and encoder will store the encoded current range information along the rising edge of a high pulse along the control signal RDR, delayed somewhat longer than the control signal RDC, only when certain additional circumstances obtain. A discussion of these will be deferred for the present. For the present purposes, it need only be understood that the encoded range information in the output range register is the ranging information which is provided to the pulse generator 152 and variable ranging divider 156.

Still within the same clocking interval during which a given signal set is being received, after another short delay, the control signal SDR will go high, the rising edge causing the shifter element 144 to store the first 15 signals in the 16-signal set. The truncated signal, of course, is in the least significant digit position. By way of example, these 15 digit positions will be assumed to be 001100000000000. This, of course, is a 2's complement representation having a value of ⅜ (e.g. ⅜ of the maximum value which the digital to analog converter 154 is generally designed to handle). Assuming the circumstances are such that a new output range code (the current range code) has been stored, the single zero next to the zero, sign digit, indicates that the value of the received signal may and will be multiplied by two. After a delay, which may be somewhat longer than previous delays, here for example assumed to be through the end of the current clocking interval and the next clocking interval, the control signal PDS will go high, causing the pulse generator to transmit a single pulse (in accordance with the output range code) to the shifter element 144. This will cause a leftward shift in the digits in the shifter element by one digit position, and effect a multiplication by two. Thus, the first 12 bits of the stored code will become 011000000000, having a value of ¾. Following this, after a delay of another clocking interval, the control signal CDR will go high, causing the converter storage register 150 to store these 12 digits in signal-represented form. The digital to analog converter 154, in accordance with well known operations, continuously converts the signal sets, such as the just-described set, which are successively presented to it by the converter storage register 150, to an analog signal.

Returning to the particular example, the variable ranging divider 156, in accordance with the output range code will divide the portion of the analog signal it receives from the digital to analog converter during the storage of this range code, by two. It will be evident, that this analog division process, accomplished along conventional lines, in fact reverses a prior multiplication. Thus, the increase in the effective range of the digital to analog converter attendant to the ranging process has been achieved in a digital to analog converter system, and further, in such a system which receives successive fully integrated sets of signals, which can be treated as such.

If what has been termed the output range in the system of FIG. 5 is changed at intervals which are too frequent, nonlinearities in circuitry incorporated in the system generally may result in inaccuracies which, for example, can be detected by the human ear. In this regard, along lines previously indicated, if the output range for one signal set indicates that there should be a multiplication by two, and an output range for the next signal set indicates that there should be a multiplication by four, nonlinearities might, for example, cause a designed multiplication by two to in fact be a multiplication by 2.1 and a designed multiplication by four to be a multiplication by 4.15. Also as previously indicated, such nonlinearities would normally not be noticed by the human ear without the occurrence of differing multiplication factors within a certain time interval of one another.

By way of a more detailed example, suppose the digital to analog conversion system 36 receives a succession of three digitally-represented values which, in the absence of any ranging restrictions, would respectively call for multiplications, by two, four and eight. Further suppose that this succession is continuously repeated. If nonlinearities, along the above lines, resulted in actual multiplications by 2.1, 4.15 and 8, the ranging process would result in inaccuracies for two of every three input values which would repeat with the same period as the succession of input values. This periodic type of error produces an effect commonly termed harmonic distortion, and is often both audible and unpleasant to a listener.

For the system of FIG. 5, however, it is apparent that if an encoded current range indicates a multiplication by a smaller factor than the encoded output range, the resulting multiplication would produce too large a result for the 2's complement number system unless the encoded output range is changed. Thus, for changes in range indicating decreases in the multiplication factors, these nonlinear effects are essentially accepted and tolerated in the system of FIG. 5. However, if the encoded current range indicates a multiplication by a larger factor than the encoded output range, it is considered beneficial within certain parameters, to sacrifice some of the advantages of ranging, to, for example, avoid the perception of the nonlinear effects. In this regard, for a succession of encoded current ranges indicative of a larger multiplication factor than indicated by the encoded output range, it is considered beneficial to prevent a change in the encoded output range for a certain period during which this situation continues. As previously noted, for sound signals, an interval of, for example, 100 milliseconds is generally satisfactory; and further, since the human ear experiences an insensitivity to relatively softer sounds for in the range of 100 milliseconds after a relatively louder sound, the sacrifice is more limited than otherwise would be the case. The timer circuit T of FIG. 4 is employed to implement this range-restricting function.

In the timer, a comparator 160 compares the current range code (in the current range register) to the output range code (in the output range register). If the current range code indicates a multiplication by a factor less than the output range code, a first comparator output line 162 will be high. This high signal, in conjunction with the next high pulse along the control signal RDR will enable a first "AND" gate 164 and, thus, a first "OR" gate 166, starting along the rising edge of the high pulse. The output from this first "OR" gate will then cause, along its rising edge, the output range register in the range detector and encoder 142 to accept and store the encoded current range, in effect along the rising edge of the RDR signal's pulse. The aforementioned comparator signal will also cause a high signal at a "No Count" input to a timing circuit 172, indicating an encoded current range corresponding to a multiplication factor less than or equal to that corresponding to the encoded output range. This will prevent the timing circuit from starting or continuing a count which it may carry on. In this regard, the timing circuit may count the reset pulses which occur at the general rate of one per sampling interval at the end of a traversal through a group of control memory storage registers. However, if the "No Count" input to the timing circuit at the time of a reset pulse is high, the timing circuit is held at a count of zero (and returned to that count if it is not zero).

On the other hand, when the encoded current range indicates that a larger multiplication factor may be used than that indicated by the encoded output range, a second output line 174 from the comparator will be high, enabling the timing circuit 172 to count once per reset pulse. The timing circuit can then be internally set to provide a high output signal after a certain number of counts have been made (uninterrupted by a reset to a count of zero). By reference to the above discussion, with the onset of the next RDR pulse after the output of the timing circuit becomes high, the range detector and encoder 142 will, along the rising edge of that pulse, replace the encoded output range with the encoded current range, indicative of an increased multiplication factor (if a current range code indicative of an unchanged or decreased multiplication factor has not intervened). The resulting high "No Count" input will cause the timing circuit to again be set back to zero with the onset of the next pulse along the reset signal R. (It is, of course, indicated by the above, that only one of the two comparator output lines can be high at any given time.) In accordance with matters noted above, a timer setting restricting increases in the multiplication factor for in the range of 100 milliseconds of an uninterrupted indication by the comparator that such an increase would otherwise be called for, is considered quite appropriate. It is evident that the timer function could be implemented in a variety of ways, for example by employing a multivibrator which would not require the reset signal R as an input.

As a final matter, it is noted that a second low pass filter 174 (FIG. 1), which receives the analog output signal from the ranging divider 156, in the system of FIG. 1 may appropriately have the same 8 kilohertz cut-off frequency as the first low pass filter 24. In addition, an analog amplifier 176 and a second transformer 178, process the analog signal from the low frequency filter, along well known lines, to provide a signal appropriate for use, for example, in producing a sound signal.

In view of the above description, it may be seen that the signal-processing system, including the analog to digital and digital to analog conversion systems, may be variously implemented and variously used depending upon specific applications. Accordingly, the scope hereof shall not be referenced to the disclosed embodiment, but on the contrary, shall be determined in accordance with the claims as set forth below.

What is claimed is:

1. A system for processing signals, comprising:
computation means for receiving said signals and for producing processed signals by carrying out operations in accordance with control information for controlling operations of said computation means and operand information to be operated on by said computation means; and
controller means for storing said control information and said operand information and for providing signals representative of said control information and said operand information, said controller means including,
control memory means coupled to said computation means and having a plurality of addressable information storage locations for storing said control information,
control member addressing means for providing to said control memory means signals for addressing said storage locations in said control memory means for said providing by said control memory means,
operand memory means coupled to said computation means and having a plurality of addressable information storage locations for storing said operand information, and
operand memory addressing means for, concurrently with said providing by said control memory addressing means, providing signals to said operand memory means for addressing said storage locations in said operand memory means for said providing by said operand memory means.

2. A signal-processing system according to claim 1 for processing signals representative of sound signals wherein said processed signals are representative of sound signals.

3. A system for processing signals, comprising:
computation means for receiving said signals and for producing processed signals by carrying out operations in accordance with control information for controlling operations of said computation means and operand information to be operated on by said computation means, said computation means including,
delay memory means having a plurality of addressable information storage locations for storing signals during said processing and for providing said stored signals after variable time delays, and
delay memory addressing means for providing signals to said delay memory means for addressing said storage locations in said delay memory means for said storing and providing by said delay memory means; and
controller means for providing signals representative of said control and operand information to said computation means, said controller means including,
control memory means coupled to said computation means and havving a plurality of addressable information storage locations for storing control information,
control memory addressing means for providing to said control memory means signals for consecutively addressing said storage locations in said control memory means in a sequence determined independently of information stored in said storage locations, for said providing by said control memory means,
operand memory means coupled to said computation means and having a plurality of addressable information storage locations for storing operand information, and
operand memory addressing means for, concurrently with said providing by said control memory addressing means, providing signals to said operand memory means for addressing said storage locations in said operand memory means for said providing by said operand memory means.

4. A signal-processing system according to claim 3 for processing signals representative of sound signals wherein said processed signals are representative of sound signals.

5. A system for processing an analog signal, comprising:
- analog to digital converter means for receiving said analog signal and for generating successive converted digitally-represented signal sets representative of said analog signal;
- computation means for producing successive processed digitally-represented signal sets by carrying out operations on said converted signal sets in accordance with control information for controlling operations of said computation means and operand information to be operated on by said computation means, said processed signal sets being representative of a processed analog signal;
- controller means for storing said control information and said operand information and for providing signals representative of said control information and said operand information, said controller means including,
  - control memory means coupled to said computation means and having a plurality of addressable information storage locations for storing said control information,
  - control memory addressing means for providing to said control memory means signals for consecutively addressing said storage locations in said control memory means in a sequence determined independently of information stored in said storage locations, for said providing by said control memory means,
  - operand memory means coupled to said computation means and having a plurality of addressable information storage locations for storing said operand information, and
  - operand memory addressing means for, concurrently with said providing by said control memory addressing means, providing signals to said operand memory means for addressing said storage locations in said operand memory means for said providing by said operand memory means; and
- digital to analog converter means for receiving said successive processed digitally-represented signal sets and for generating said processed analog signal of which said processed signal sets are representative.

6. A signal processing system according to claim 5 for processing an analog signal representative of a sound signal wherein said processed analog signal is representative of a sound signal.

7. A system for processing signals, comprising:
- computation means for receiving said signals and for producing processed signals by carrying out operations in accordance with control information for controlling operations of said computation means and operand information to be operated on by said computation means, said computation means including,
  - delay memory means having a plurality of addressable information storage locations for storing signals during said processing and for providing said stored signals after variable time delays, and
  - delay memory addressing means for providing signals to said delay memory means for addressing said storage locations in said delay memory means for said storing and providing by said delay memory means; and
- controller means for providing signals representative of said control and operand information to said computation means, said controller means including,
  - control memory means coupled to said computation means and having a plurality of addressable information storage locations for storing control information,
  - control memory addressing means for, concurrently with said providing by said delay memory addressing means, providing to said control memory means signals for addressing said storage locations in said control memory means for said providing by said control memory means,
  - operand memory means coupled to said computation means and having a plurality of addressable information storage locations for storing operand information, and
  - operand memory addressing means for, concurrently with said providing by said delay memory addressing means and said control memory addressing means, providing signals to said operand memory means for addressing said storage locations in said operand memory means for said providing by said operand memory means.

8. A system for processing signals, comprising:
- computation means for receiving said signals and for producing processed signals by carrying out operations in accordance with control information for controlling operations of said computation means and operand information to be operated on by said computation means; and
- controller means for storing said control information and said operand information and for providing signals representative of said control information and said operand information, said controller means including,
  - control memory means coupled to said computation means and having a plurality of addressable information storage locations for storing said control information,
  - control memory addressing means for providing to said control memory means signals for consecutively addressing said storage locations in said control memory means in a sequence determined independently of information stored in said storage locations, for said providing by said control memory means,
  - operand memory means coupled to said computation means and having a plurality of addressable information storage locations for storing said operand information, and
  - operand memory addressing means for providing signals to said operand memory means for addressing said storage locations in said operand memory means for said providing by said operand memory means.

9. A digital to analog converter system for generating an analog signal of which successive digitally-represented, multidigit signal sets are indicative, comprising:
- means for receiving said successive digitally-represented signal sets and for generating modified digitally-represented, multidigit signal sets having values which are indicative in each case of the value of an unmodified digitally-represented signal set multiplied by a factor representative of a variable range classification for said unmodified signal sets, said receiving and generating means including means for generating signals representative of said range classification;

converter means for producing in response to said modified digitally-represented signal sets, an analog signal of which said modified signal sets are indicative;

means for generating in response to said analog signal and said signals representative of said range classification, a modified analog signal having values along portions thereof, indicative for each portion, of the values along a corresponding portion of said unmodified analog signal divided by a factor indicative in each case of the multiplication factor for an unmodified digitally-represented signal set corresponding to the portion of said unmodified analog signal; and timing means for preventing changes in said variable range classification which would be represented by successively greater multiplication factors within a predetermined time interval and permitting changes in said variable range classification which are represented by successively smaller multiplication factors within said predetermined interval.

10. A digital to analog converter system for generating an analog signal of which successive digitally-represented, multidigit signal sets are indicative, comprising:

means for receiving said successive digitally-represented signal sets and for generating modified digitally-represented, multidigit signal sets having values which are indicative in each case of the value of an unmodified digitally-represented signal set multiplied by a factor representative of a variable range classification for said unmodified signal sets, said receiving and generating means including means for shifting the digits repesented in a plurality of adjoining digit positions in an unmodified signal set to positions in the corresponding modified signal set which represent a shift of said digits a number of positions corresponding to the multiplication factor for said unmodified signal set, and including means for generating signals representative of said range classification;

converter means for producing in response to said modified digitally-represented signal sets, an analog signal of which said modified signal sets are indicative;

means for generating in response to said analog signal and said signals representative of said range classification, a modified analog signal having values along portions thereof, indicative for each portion, of the values along a corresponding portion of said unmodified analog signal divided by factor indicative in each case of the multiplication factor for an unmodified digitally-represented signal set corresponding to the portion of said unmodified analog signal; and timing means for preventing changes in said variable range classification which would be represented by successively greater multiplication factors within a predetermined interval and permitting changes in said variable range classification which are represented by successively smaller multiplication factors within said predetermined interval.

* * * * *

UNITED STATES PATENT AND TRADEMARK OFFICE
CERTIFICATE OF CORRECTION

PATENT NO. : 4219880

DATED : 8/26/80

INVENTOR(S) : Charles R. Nichols

It is certified that error appears in the above-identified patent and that said Letters Patent are hereby corrected as shown below:

Column 2, line 32, "P." should be --p.--
Column 4, line 32 should be --$(-1 < V < -7/8)$--
Column 4, line 36 "110" should be --$\underline{1}10$--
Column 4, line 52 delete "-" at end of line; insert --,--
Column 4, line 53 delete "," at beginning of line
Column 6, line 50, delete "," after "FIG. 5"
Column 12, line 14, "carrier" should be --carries--
Column 13, line 26, "36" should be --76--
Column 15, line 60, "reprsentative" should be --representative--
Column 16, line 54, "after" should be --$\underline{after}$--
Column 17, line 16, in body of table one dash should be two dashes, i.e. -- in two places
Column 17, line 18, in body of table one dash should be two dashes, i.e. -- in two places
Column 17, line 21, in body of table one dash should be two dashes, i.e. -- in two places
Column 17, line 22, in body of table one dash should be two dashes, i.e. -- in two places
Column 17, line 24, in body of table one dash should be two dashes, i.e. -- in two places

UNITED STATES PATENT AND TRADEMARK OFFICE
CERTIFICATE OF CORRECTION

PATENT NO. : 4219880

DATED : 8/26/80

INVENTOR(S) : Charles R. Nichols

It is certified that error appears in the above-identified patent and that said Letters Patent are hereby corrected as shown below:

Column 17, line 25, in body of table one dash should be two dashes, i.e. -- in two places Column 18, line 21, "resister" should be --register--

Column 18, line 24, "," after the word interval should be --.--

Column 18, line 28, New Paragraph beginning with "There are"

Column 24, line 19, "of the high" should be --of a high--

Column 30, line 5, "member" should be --memory--

Column 30, lines 41-44, move this subparagraph to left two spaces like lines 25-31; note, apart from the correct indentation, the punctuation establishes the relationship between the elements of the claim.

Column 30, lines 49-55, move this subparagraph to left two spaces like lines 45-48; note, apart from the correct indentation, the punctuation establishes the relationship between the elements of the claim.

Column 31, lines 44-48, don't indent two spaces; i.e. move to left two spaces like lines 5-8; note, apart from the correct indentation, the punctuation establishes the relationship between the elements of the claim.

Signed and Sealed this

Twenty-seventh Day of January 1981

[SEAL]

Attest:

RENE D. TEGTMEYER

Attesting Officer

Acting Commissioner of Patents and Trademarks